(12) United States Patent
Phaneuf et al.

(10) Patent No.: US 11,366,074 B2
(45) Date of Patent: Jun. 21, 2022

(54) METHOD FOR CROSS-SECTION SAMPLE PREPARATION

(71) Applicant: Fibics Incorporated, Ottawa (CA)

(72) Inventors: Michael William Phaneuf, Ottawa (CA); Ken Guillaume Lagarec, Ottawa (CA); Andrew John Murray, Ottawa (CA)

(73) Assignee: FIBICS INCORPORATED, Ottawa (CA)

( * ) Notice: Subject to any disclaimer, the term of this patent is extended or adjusted under 35 U.S.C. 154(b) by 0 days.

(21) Appl. No.: 16/754,925

(22) PCT Filed: Oct. 12, 2018

(86) PCT No.: PCT/CA2018/051283
§ 371 (c)(1),
(2) Date: Apr. 9, 2020

(87) PCT Pub. No.: WO2019/071352
PCT Pub. Date: Apr. 18, 2019

(65) Prior Publication Data
US 2020/0264115 A1      Aug. 20, 2020

Related U.S. Application Data

(60) Provisional application No. 62/571,905, filed on Oct. 13, 2017.

(51) Int. Cl.
*G01N 23/2255* (2018.01)
*G01N 1/28* (2006.01)
(Continued)

(52) U.S. Cl.
CPC ........... *G01N 23/2255* (2013.01); *G01N 1/28* (2013.01); *G01N 1/286* (2013.01); *G01N 1/2806* (2013.01);
(Continued)

(58) Field of Classification Search
CPC ........... G01N 23/2255; G01N 23/2202; G01N 1/286; G01N 1/28; G01N 1/2806;
(Continued)

(56) References Cited

U.S. PATENT DOCUMENTS

| 9,633,819 B2 | 4/2017 | Phaneuf et al. |
| 2004/0089821 A1 | 5/2004 | Shichi et al. |

(Continued)

FOREIGN PATENT DOCUMENTS

| EP | 2104864 | 9/2009 |
| WO | 2007082380 A1 | 7/2007 |

OTHER PUBLICATIONS

Extended European Search Report issued in corresponding European patent application No. 18866354.6 dated Jun. 9, 2021.
(Continued)

*Primary Examiner* — Kiet T Nguyen
(74) *Attorney, Agent, or Firm* — Shin Hung; VanTek IP LLP

(57) ABSTRACT

A novel method for cross-section sample preparation has a sample oriented normal to an SEM/GFIS or other imaging column via a stage, and is operated upon by an FIB to form the cross-section pre-lamella within the sample, followed by an approximate 90° rotation with no tilt of the stage for cut out by the FIB. Asymmetric trenches are milled to have a three-dimensional depth profile to ensure that the FIB has clear line of sight to a face of the resulting pre-lamella when the sample has been rotated. The three-dimensional depth profile further minimizes overall milling time required for the preparation of the pre-lamella.

22 Claims, 23 Drawing Sheets

(51) Int. Cl.
*H01J 37/20* (2006.01)
*G01N 23/2202* (2018.01)

(52) U.S. Cl.
CPC ......... *G01N 23/2202* (2013.01); *H01J 37/20* (2013.01); *G01N 2001/2873* (2013.01); *G01N 2223/418* (2013.01); *H01J 2237/006* (2013.01); *H01J 2237/31745* (2013.01); *H01J 2237/31749* (2013.01)

(58) Field of Classification Search
CPC ...... G01N 2001/2873; G01N 2223/418; H01J 37/20; H01J 2237/006; H01J 2237/31745; H01J 2237/31749; H01J 2237/20214
USPC .......................................... 250/306, 307, 309
See application file for complete search history.

(56) References Cited

U.S. PATENT DOCUMENTS

| | | | |
|---|---|---|---|
| 2006/0011867 | A1 | 1/2006 | Kidron et al. |
| 2010/0308219 | A1* | 12/2010 | Blackwood ......... H01J 37/3056 250/307 |
| 2013/0248354 | A1 | 9/2013 | Keady et al. |
| 2013/0319849 | A1* | 12/2013 | Fuller ...................... G01N 1/32 204/192.34 |
| 2014/0084157 | A1 | 3/2014 | Miller et al. |
| 2015/0137003 | A1* | 5/2015 | Liew .................... G01N 1/2813 250/453.11 |
| 2016/0189929 | A1* | 6/2016 | Hammer ................. G01N 1/32 250/492.21 |

OTHER PUBLICATIONS

International Patent Application No. PCT/CA2018/051283, International Search Report and Written Opinion dated Jan. 23, 2019.
International Preliminary Report on Patentability in International Application No. PCT/CA2018/051283, dated Apr. 14, 2020.
Phaneuf et al., "Site-specific TEM Specimen Preparation of Grain Boundary Corrosion in Nickel-Based Alloys Using the FIB "Plan-View Lift-Out" Technique," Microscopy and Microanalysis, Aug. 2002, vol. 8 (S02), pp. 1266-1267.

* cited by examiner

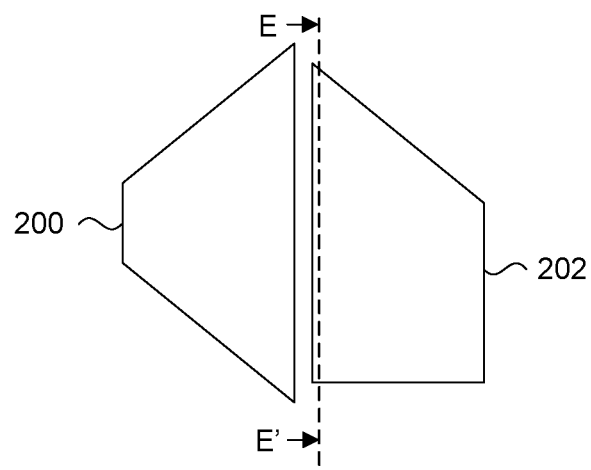
FIG. 5D
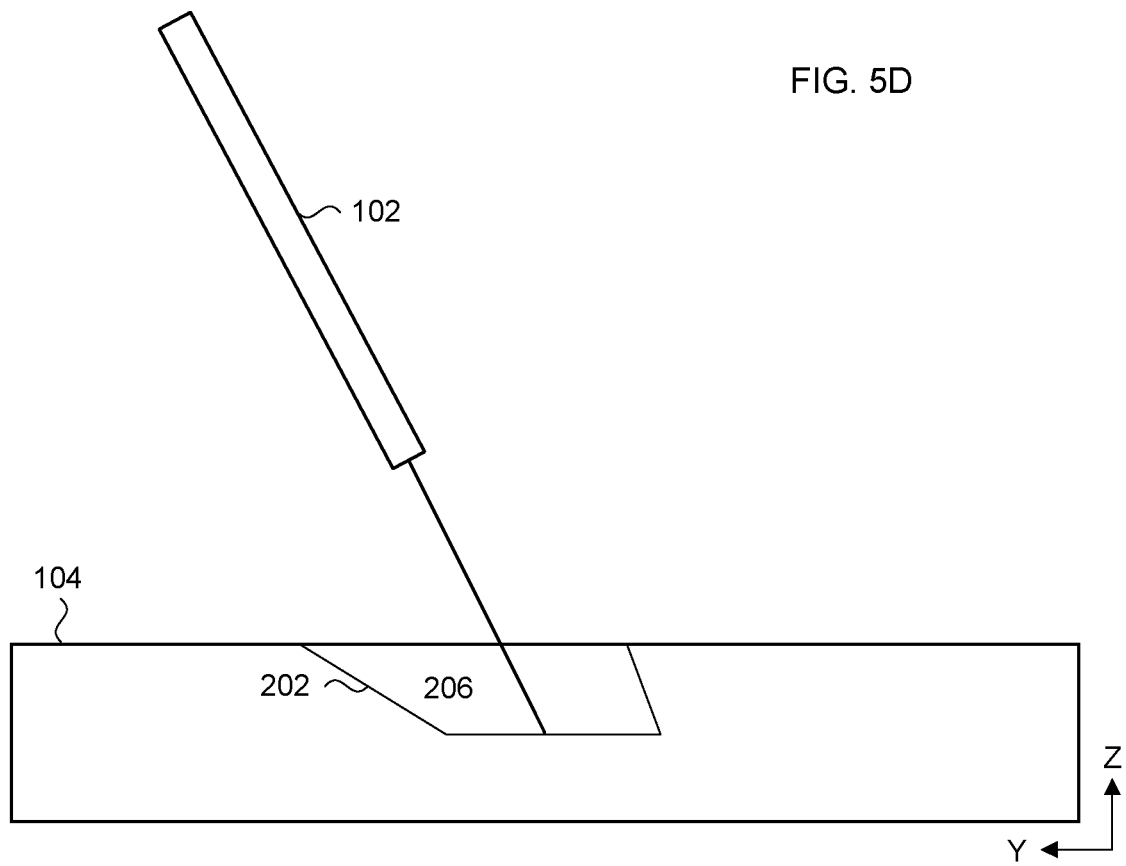

METHOD FOR CROSS-SECTION SAMPLE PREPARATION

CROSS REFERENCE TO RELATED APPLICATIONS

This application claims the benefit of priority of U.S. Provisional Patent Appln No. 62/571,905, filed on Oct. 13, 2017, which is hereby incorporated by reference. This application incorporates by reference PCT publication number WO2007082380A1 titled "Redeposition technique for membrane attachment", filed on Jan. 19, 2007 and claiming priority to U.S. provisional patent application No. 60/759,960 filed on Jan. 19, 2006.

FIELD

The present invention relates generally to focused ion beam (FIB) systems. More particularly, the present invention relates to preparing cross-section samples using an FIB system or similar charged particle beam system.

BACKGROUND

Focused ion beam (FIB) systems have become valuable tools in the production of specimens for transmission electron microscopy (TEM) in the semiconductor and materials sciences as well as in the life sciences. The "nanomachining" capability of FIB systems, combined with the use of manipulator or transport tools, allows the removal of a small section of a material for TEM analysis, leaving the remainder of the material intact. The small section removed from the material is typically referred to as a specimen, membrane, volume, sample or lamella. A TEM lamella is typically thinned to a thickness of 100 nm or less.

Typical approaches to FIB-based TEM specimen preparation, including the use of a so-called lift-out tool, are discussed in, for example, Introduction to Focused Ion Beams: Instrumentation, Theory, Techniques and Practice, Lucille A. Giannuzzi and Fred A. Stevie, Eds., Springer, New York, 2005 ISBN 038723116-1. Typical methods of performing in-situ lift-out of a specimen or volume for TEM investigation involve using an FIB system and gas-assisted deposition of a material. For example, FIB deposited metals, e.g. tungsten or platinum, or non-metallic FIB deposited materials, e.g. carbon or silicon oxide, can be used to attach a specimen, or a volume from which a specimen will be produced, to a transport tool and/or carrier grid that can be inserted into the TEM system.

A region of the host material from which the specimen is to be taken is nanomachined by the FIB to define a small volume that contains the region of interest that will ultimately become a TEM specimen, this small volume being referred to as a "pre-lamella", which can subsequently be thinned down to the ultimate TEM lamella thickness, or otherwise prepared and imaged or analyzed; for example, an extracted pre-lamella may be ideal for analysis by energy dispersive x-ray diffraction with minimal signal interference from the surrounding substrate—such a pre-lamella may be analyzed as multiple slices (yielding multiple analyses) through a serial sectioning process as described in commonly owned U.S. Pat. No. 9,633,819, which is herein incorporated by reference. Alternately, a pre-lamella may be formed in the shape of a wedge or an "inverted barn" to as to allow further fabrication into a plan-view specimen as described in Phaneuf, M. W. and Patterson, R. J., Site-specific TEM Specimen Preparation of Grain Boundary Corrosion in Nickel-Based Alloys Using the FIB "Plan-View Lift-Out" Technique, Microscopy and Microanalysis, August 2002, vol. 8, pp. 1266-1267, which is herein incorporated by reference.

Subsequently, the FIB is used to attach a transport tool, e.g. a transport needle, to the small volume through gas-assisted material deposition, whereby the FIB is rastered over a region that overlaps both the tip of the transport needle and a portion of the small volume. The interaction of the FIB with the deposition gas leads to the deposition of material over the region that is rastered by the FIB, thereby attaching the nanomachined small volume to the transport tool.

The FIB is then used to completely mill the perimeter of the rastered region to free the specimen from the host material. Once attached to the transport tool, the transport tool moves the specimen to a TEM grid where, once again, FIB gas-assisted material deposition is used to attach the specimen to the grid. The transport tool is then detached from the specimen.

These methods always rely on the deposited material to originate from a carrier gas that decomposes in the presence of the FIB. For example, in the case of FIB deposited tungsten, tungsten carbonyl is used as a carrier gas to deposit a volume of material containing tungsten on the specimen surface. Unfortunately, the carrier gas floods the entire FIB system chamber and may decompose or adsorb over undesirable regions of the host material and over other samples present in the FIB system chamber, thereby leading to sample contamination. This is particularly undesirable in cases where FIB systems are used in industrial semiconductor fabrication facilities to examine partially processed wafers and where contamination can affect subsequent downstream manufacturing of the target wafer as well as the manufacturing lines themselves.

Other methods used in the preparation of specimens for TEM analysis forgo the step of depositing a material on the specimen area in order to attach the transport tool to the specimen. Instead, these methods use a micro-electromechanical (MEMS) manipulator device, or a similar nano-scale-motion mechanism to precisely position a transport tool so as to remove the milled-out specimen and to transport the specimen to the TEM grid. However, as in the method described above, in a subsequent step the specimen is still attached to the TEM grid using FIB gas-assisted material deposition. In both types of methods, the securing of the specimen to a grid allows the specimen and grid to be removed from the FIB system chamber and brought to a TEM analysis chamber. However, the requirement of using FIB gas-assisted material deposition to attach the specimen to the grid introduces the potential for contamination.

Still other methods of securing the specimen involve the use of a mechanical "force fit" of the specimen or the volume of interest that includes the specimen (and will be subsequently nanomachined to produce the specimen) into a mechanical holder or grid. This method may not require the use of FIB gas assisted deposition, however the act of physically inserting the specimen into the force-fit holder can cause stress on the specimen, the stress creating undesirable artifacts. For example, when attempting to produce a TEM specimen from a region containing a corroded grain boundary, the force required to achieve the necessary force fit attachment can tear open the grain boundary of interest, causing artifacts that affect the subsequent analysis to the point where the analysis may be invalid. A similar effect can sometimes be observed in semiconductor devices with structurally "weak" polymer based "low-k" dielectrics, which cannot withstand the forces required to achieve the force-fit.

In addition to increasing the risk of contamination, gas-assisted material deposition requires the insertion and removal of a gas nozzle in the FIB system chamber, in proximity to the sample from which the specimen is taken and to the substrate on which the specimen is to be attached. This contributes to vibration as well as more stringent limits on sample geometries and positioning. If the sample height is not properly set, the gas nozzle can crash into the sample and destroy it. As well, proper adjustment of the gas flow is necessary to obtain the proper conditions for deposition.

For applications involving the production of a pre-lamella, another problem is the amount of time required to produce the thinned pre-lamella of material that is ready for extraction from the bulk. In typical methods, rectangular trenches are milled into the surface of the sample, such that the rectangular trenches are spaced apart from each other by desired distance which thus forms the desired slice of material. A problem here is that after the trenches have been milled to the desired depth and length, the remaining lamella must be removed. Typical methods require a tilting of the sample towards the beam, which requires a significant amount of time to do. Once tilted towards the beam (by tilting the stage on which the sample has been secured), the pre-lamella can be cut out from the sample by trimming at the edges of the slice. Then the stage needs to be returned to the default 0° tilt position. This process can take upwards of 45 minutes just for sample preparation. It should be appreciated that it is difficult to process a large number of such slices of material within a reasonable amount of time due to the required tilting manipulations of the stage.

Therefore, it is desirable to provide a method of fabricating TEM specimens that does not require the use of gas-assisted deposition of material yet does not require a force-fit type attachment of the specimen to the carrier, and done with a minimum amount of time.

SUMMARY

It is an object of the present embodiments to obviate or mitigate at least one disadvantage of previous methods used in fabricating TEM specimens.

In a first aspect, there is provided a method for preparing a pre-lamella sample with a focused ion beam system. The method includes milling a first trench into a surface of a material; milling a second trench into the surface of the material spaced from the first trench to form the pre-lamella sample, where the space between the first and second trenches defines an approximate width of the pre-lamella sample; rotating the material to have a wall of the pre-lamella sample in the second trench faces an FIB column, the second trench having a three dimensional depth profile providing line of sight between the FIB column and bottom and side edges of the pre-lamella sample; and cutting the bottom and side edges of the pre-lamella sample connected to the material to facilitate mechanical removal of the pre-lamella sample from the material.

In an embodiment of this first aspect, the FIB column is oriented in three dimensional space defined by X, Y and Z dimensions, where the X and Y dimensions are orthogonal to each other and the Z dimension is normal to the X and Y dimensions. Milling of the first trench includes milling a first pre-lamella wall having a vector equal to the X, Y vector of the FIB column, and milling of the second trench includes milling a second pre-lamella wall having a vector equal to the X, Y vector of the FIB column.

According to further embodiments, milling the first trench includes milling the first pre-lamella wall to a first depth and milling the second trench includes milling the second pre-lamella wall to a second depth greater than the first depth, where the first trench is milled to have with a first predetermined three-dimensional gradient from the first depth to the surface of the material in a direction normal to the first pre-lamella wall and the pre-lamella sample has a rectangular shaped analysis area and a triangle shaped handle area extending from the rectangular shaped analysis area. In this further embodiment, the second trench is milled to have a second predetermined three-dimensional gradient from the second depth to the surface of the material in a direction normal to the second pre-lamella wall.

In the embodiment of the first aspect, the first pre-lamella wall and the second pre-lamella wall are polished prior to rotating the material, where the rotation of the material can be approximately 90°. In this particular embodiment, the first pre-lamella wall has a length that completely overlaps the second pre-lamella wall and the entire area defined by the second pre-lamella wall forms the pre-lamella sample.

In another embodiment of the first aspect, the first pre-lamella wall partially overlaps the second pre-lamella wall, and the overlapping portions of the first pre-lamella wall and the second pre-lamella wall forms the pre-lamella sample.

According to an embodiment of the first aspect, a stage supporting the material can be maintained at a constant tilt angle during milling of the first trench, milling of the second trench, rotating the material and cutting the bottom and side edges of the pre-lamella sample, where the constant tilt angle is a 0° tilt angle. According to an alternate embodiment, a tilt to the stage supporting the material is applied prior to cutting the bottom and side edges of the pre-lamella sample.

In a further embodiment of the first aspect, cutting includes fully cutting the bottom and a first side edge of the pre-lamella sample, and partially cutting a second side edge of the pre-lamella sample to leave a portion thereof connected to the material. The method can further include attaching a lift out device to the pre-lamella sample prior to cutting. Attaching the lift out device can include gas-assisted deposition of the lift out device to the pre-lamella sample. Attaching the lift out device can include gas-less redeposition of the lift out device to the pre-lamella sample. Attaching the lift out device can include gripping the pre-lamella sample with a micro tweezer.

In the embodiment where micro tweezer is used, the pre-lamella sample is moved with the micro tweezer to a substrate carrier, and the micro tweezer is controlled to hold the sample against a surface of the substrate carrier. Gas-less redeposition is executed to bind the pre-lamella sample to the surface of the substrate carrier.

In another aspect, there is provided a method of securing a micro-object to a substrate. The method includes placing the micro-object on the substrate by holding it with a pair of micro tweezer's or nano-grippers close to or in contact with the substrate surface; and subjecting a target area of the substrate adjacent the micro-object to an FIB for removing material from the target area. Some removed material from the target area is thereby redeposited over the micro-object and the substrate to attach the micro-object to the substrate.

The FIB can be a focused ion beam (FIB), and the FIB is rastered over the target area in successive steps. The FIB has an associated current and dwell time for each step, the current and dwell time being pre-determined in accordance with material properties of the substrate and with physical characteristics of the micro-object. Furthermore, the FIB rasters the target area starting at a position of the target area closest to the micro-object and ending at another position of the target area furthest from the micro-object, where the dwell time for each step can be at least 50 μs. Alternately, the target area is rastered in a series of lines, a distance between dwell points in a given line being different from a spacing between consecutive lines. The step of subjecting a target area of the substrate adjacent the micro-object to an FIB to remove material from the target area, can be repeated for at least one more target area.

The micro-object can be a volume of an electron microscopy specimen produced by nanomachining, an electron microscopy specimen, a specimen taken from a semiconductor wafer a micro-electromechanical device or a biological specimen. The substrate can be one of a conductive and a semiconductive substrate, or the substrate can be a metal, boron, boron carbide or silicon.

The substrate can include an electrically conductive area and an insulator area. The micro-object is placed at least partly on the electrically conductive area, and the target area includes at least partly the insulator area. The step of placing the micro-object on the substrate can be followed by a step of holding the micro-object on the substrate, and the step of subjecting a target area of the substrate adjacent the micro-object to an FIB is followed by a step of releasing the micro-object.

Additionally, there is a method of preparing a transmission electron microscopy specimen. The method includes placing the specimen on a substrate; subjecting a target area of the substrate adjacent the specimen to an FIB for removing material from the target area such that some removed material from the target area is redeposited over the specimen and the substrate to the specimen to the substrate; and subjecting the specimen to the FIB to remove material obscuring a region of interest of the specimen. In an embodiment of the present aspect, the step of subjecting the specimen to an FIB can include thinning the specimen to electron transparency.

In another aspect, there is provided transmission electron microscopy (TEM) carrier grid. This carrier grid includes a planar body, and reservoir, and a channel. The planar body has a predetermined shape with a post for receiving a sample. The reservoir is formed within the body for storing a gas. The channel extends from the reservoir to end in the post, where an end of the post is configured for breakage to expose an end of the channel and thereby release the gas stored in the reservoir.

According to an alternate embodiment, the carrier grid has a first silicon panel and a second silicon panel. The first silicon panel has a predetermined shape with a post, and further includes a reservoir space containing a gas with a channel extending from the reservoir to end in the post, where an end of the post is configured for breakage to expose an end of the channel. The second silicon panel has the predetermined shape of the first silicon panel bonded to the first silicon panel to seal the gas in the reservoir and the channel.

Other aspects and features of the present embodiments will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 5D is a side view illustration of the sample in FIG. 4 taken along cross-section E-E', according to a present embodiment;

DETAILED DESCRIPTION

For the purpose of the description, the term micro-object means any object too small to be manipulated directly by a technician. Such micro-objects include, for example, specimens or volumes taken for any type of solid material, semiconductor devices, biological specimens and micro-electromechanical structures (MEMS).

The following embodiments illustrate techniques and apparatus for improving known methods for preparing a cross-section sample (pre-lamella) for TEM applications. First is a description of a typical charged particle beam (CPB) system, as shown in FIG. 1, which will provide context for the later described embodiments.

Figure 1:
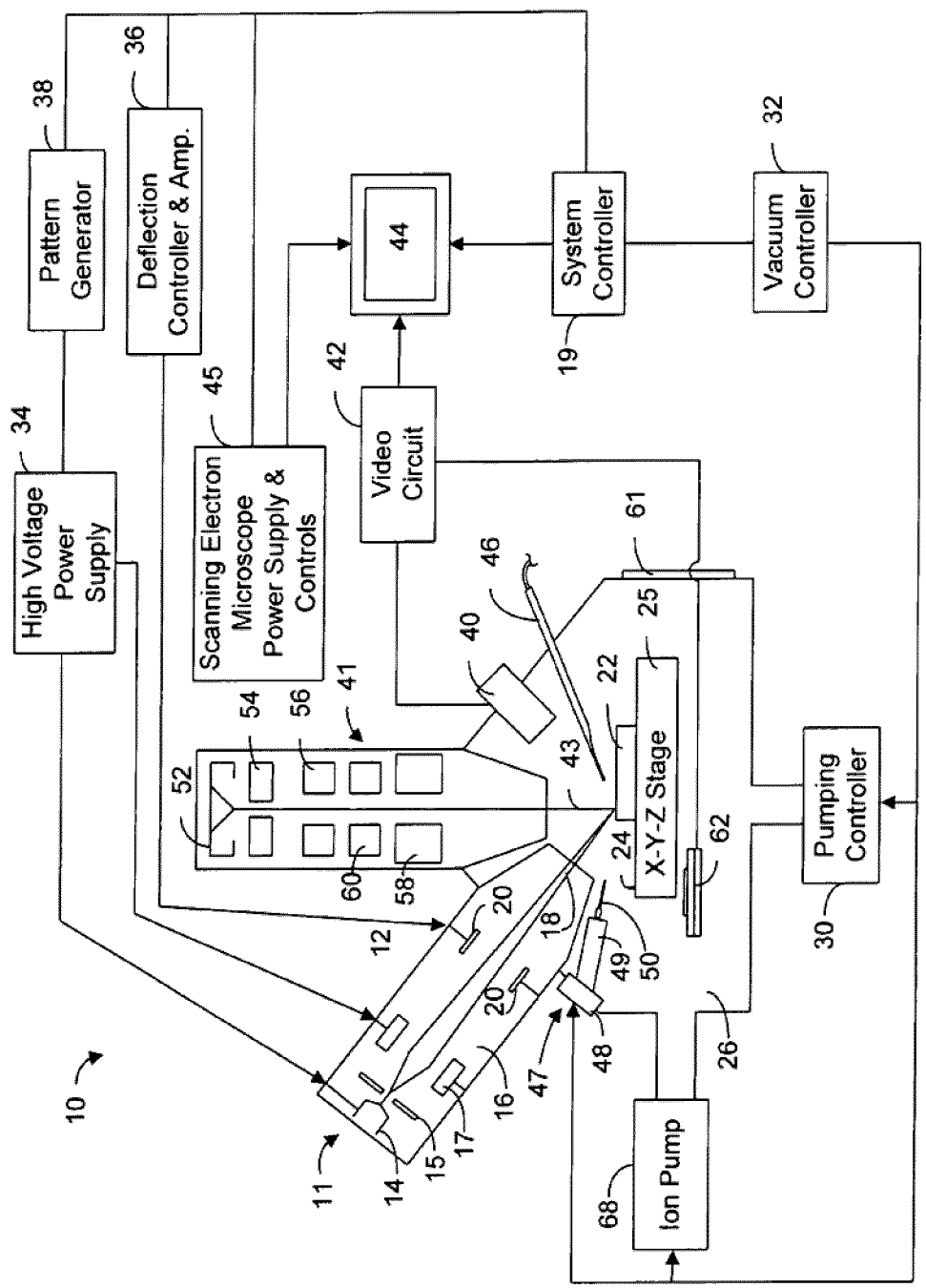
FIG. 1 is a schematic of a known CPB system of the prior art.

FIG. 1 is a schematic of a typical CPB system 10. This CPB system 10, also referred to as a dual beam or cross beam system, includes a vertically mounted SEM column and a focused ion beam (FIB) column mounted at an angle from vertical (although alternate geometric configurations also exist). A scanning electron microscope 41, along with power supply and control unit 45, is provided with the dual beam system 10. An electron beam 43 is emitted from a cathode 52 by applying voltage between cathode 52 and an anode 54. Electron beam 43 is focused to a fine spot by means of a condensing lens 56 and an objective lens 58. Electron beam 43 is scanned two-dimensionally on the sample by means of a deflection coil 60. Operation of condensing lens 56, objective lens 58, and deflection coil 60 is controlled by power supply and control unit 45. Electron beam 43 can be focused onto sample 22, which is on movable stage 25 within lower chamber 26. When the electrons in the electron beam strike sample 22, various types of electrons are emitted. These electrons may be detected by various detectors within the electron column or they may detected by one or more electron detectors 40 external to the column.

Dual beam system 10 also includes focused ion beam (FIB) system 11 which comprises an evacuated chamber having an upper neck portion 12 within which are located an ion source 14 and a focusing column 16 including extractor electrodes and an electrostatic optical system. The axis of focusing column 16 is tilted at an angle, such as 54 degrees from the axis of the electron column by example. The ion column 12 includes an ion source 14, an extraction electrode 15, a focusing element 17, deflection elements 20, and a focused ion beam 18. Ion beam 18 passes from ion source 14 through column 16 and between electrostatic deflection means schematically indicated at 20 toward sample 22, which comprises, for example, a semiconductor device positioned on movable stage 25 within lower chamber 26.

Stage 25 can preferably move in a horizontal plane (X and Y axes) and vertically (Z axis). Stage 25 can be tilted and rotated about the Z axis. A door or load lock 61 is opened for inserting sample 22 onto X-Y stage 25 and also for servicing an internal gas supply reservoir, if one is used. The door is interlocked so that it cannot be opened if the system is under vacuum.

An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10^{-7}$ Torr and $5\times10^{-4}$ Torr. If performing gas assisted processes such as etching or deposition, an etch retarding gas, or a deposition precursor gas is used, the chamber background pressure may rise, typically to about $1\times10^{-5}$ Torr.

The high voltage power supply provides an appropriate acceleration voltage to electrodes in ion beam focusing column 16 for energizing and focusing ion beam 18. When it strikes sample 22, material is sputtered, that is physically ejected, from the sample. Alternatively, ion beam 18 can decompose a precursor gas to deposit a material on the surface of the sample.

High voltage power supply 34 is connected to liquid metal ion source 14 as well as to appropriate electrodes in ion beam focusing column 16 for forming an approximately 1 keV to 60 keV ion beam 18 and directing the same toward a sample. Deflection controller and amplifier 36, operated in accordance with a prescribed pattern provided by pattern generator 38, is coupled to deflection plates 20 whereby ion beam 18 may be controlled manually or automatically to trace out a corresponding pattern on the upper surface of sample 22. The liquid metal ion source 14 typically provides a metal ion beam of gallium. The source typically is capable of being focused into a sub one-tenth micrometer wide beam at sample 22 for either modifying the sample 22 by ion milling, enhanced etch, material deposition, or for the purpose of imaging the sample 22. Note that newer source technologies such as plasma, gas field ion sources and/or atomic level ion sources will produce other ionic species besides gallium.

A charged particle detector 40 used for detecting secondary ion or electron emission is connected to a video circuit 42 that supplies drive signals to video monitor 44 and receiving deflection signals from controller 19. The location of charged particle detector 40 within lower chamber 26 can vary in different configurations. For example, a charged particle detector 40 can be coaxial with the ion beam and include a hole for allowing the ion beam to pass. In other configurations, secondary particles can be collected through a final lens and then diverted off axis for collection.

A micromanipulator 47 can precisely move objects within the vacuum chamber. Micromanipulator 47 may include precision electric motors 48 positioned outside the vacuum chamber to provide X, Y, Z, and control the portion 49 positioned within the vacuum chamber. The micromanipulator 47 can be fitted with different end effectors 50 for manipulating small objects.

A gas delivery system 46 extends into lower chamber 26 for introducing and directing a gaseous vapor toward sample 22. For example, xenon difluoride can be delivered to enhance etching, or a metal organic compound can be delivered to deposit a metal.

A system controller 19 controls the operations of the various parts of dual beam system 10. Through system controller 19, an operator can control ion beam 18 or electron beam 43 to be scanned in a desired manner through commands entered into a conventional user interface (not shown).

According to a further embodiment, there is provided a novel technique for preparing and extracting a specimen from a sample. More specifically, the presently described technique for sample preparation reduces the amount of time for preparing a pre-lamella sample from a bulk material using an FIB system such as the one described in FIG. 1, which could include a semiconductor device, a biological specimen prepared in cryo conditions, or any other homogenous or heterogeneous mass of material.

Figure 2:
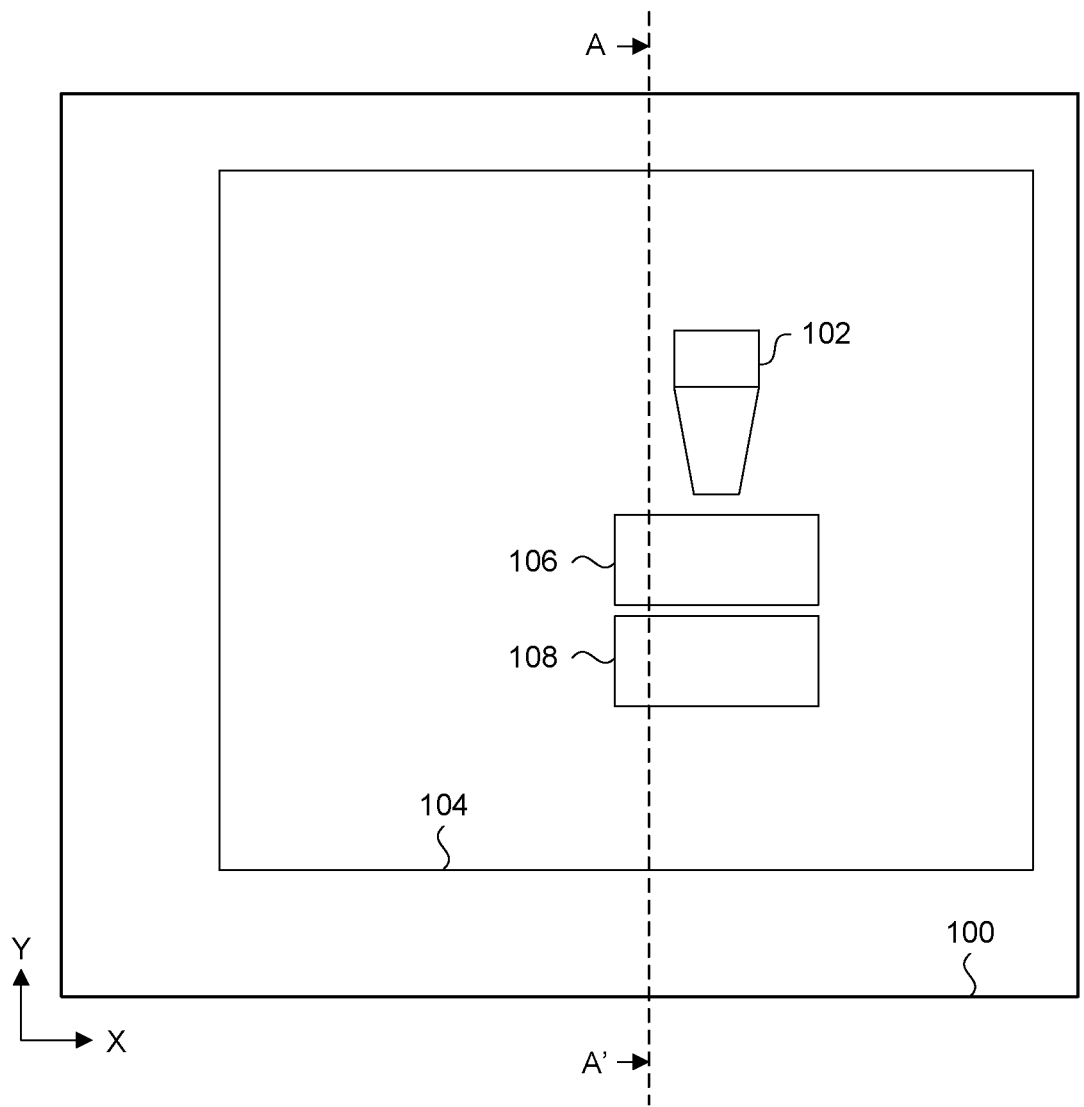
FIG. 2 is a plan view illustration showing rectangular trenches in a sample for pre-lamella formation within an FIB chamber, according to the prior art.
Figure 3:
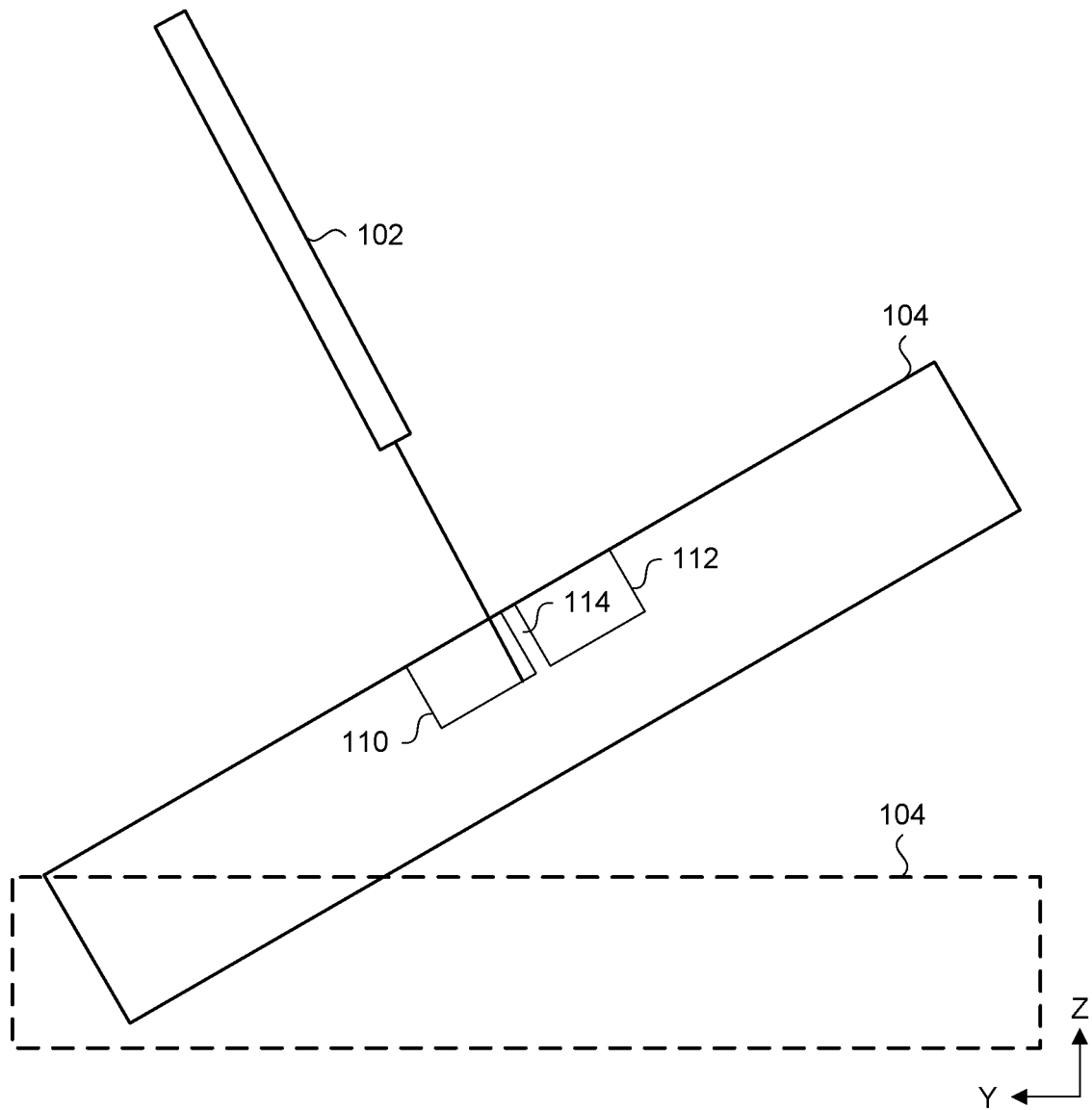
FIG. 3 is a side view illustration of the sample in FIG. 1 taken along cross-section A-A', according to the prior art.

As previously mentioned, current techniques for cross-section sample preparation include tilting of the stage. An example of such a technique is shown in FIG. 2 and FIG. 3. FIG. 2 is a diagram showing a stage 100 within an FIB chamber. Those skilled in the art will understand that FIG. 2 shows only a portion of an actual stage 100, as FIG. 2 is not intended to be shown to scale. In the presently shown arrangement, stage 100 is at a default 0° tilt angle relative to the electron beam column (not shown). This means that the plane of the stage is normal to the electron beam column. As annotated in FIG. 2, stage 100 has X and Y dimensions and a Z dimension (not shown) that extends normal to both the X and Y dimensions. An FIB column 102 is positioned to extend in the Z and Y dimensions with no X dimension component in the presently shown orientation of FIG. 2. In this example, a sample 104 is secured to the stage 100. A pair of rectangular milling patterns 104 and 106 are defined on the surface of the sample 104 where the spacing between the closest sides of the milling patterns 104 and 106 is the intended pre-lamella.

An example side view of the sample 104 taken along cross-section line A-A' of FIG. 2 is illustrated in FIG. 3, where the stage 100 is not shown. The dashed box shows the orientation of the sample 104 when the stage is at the default 0° tilt angle. The sample 104 is tilted by positively tilting the stage 100 such that the axis of the FIB column 102, and the FIB, is normal to the surface of sample 104. The FIB is then rastered within the boxes defined by milling patterns 104 and 106 to produce respective trenches 110 and 112. FIG. 2 shows the completed trenches, and the thin material between the trenches is the desired pre-lamella 114. Now the sample 104 is tilted in the reverse direction and to a negative angle to expose a bottom edge of the pre-lamella 114 for cut out by the FIB. A lift out needle can be attached to a top of the pre-lamella 114 and once the side edges of the pre-lamella 114 are cut from the sample 104, the pre-lamella 114 can be removed from sample 104 and moved elsewhere, such as to a TEM sample carrier grid. Alternately, a micro manipulator can grip some portion of the pre-lamella 114 prior to full cut out from the sample, for moving the pre-lamella 114.

As previously mentioned, the tilting required for this conventional method consumes a large amount of time and therefore reduces cross sectioning throughput.

According to the present embodiment of cross-section sample preparation, the sample surface is milled with a pair of asymmetric trenches adjacent to each other and spaced apart such that the remaining pre-lamella separating the resulting trenches forms cross-section slice. According to the present embodiments, an asymmetric trench has a pre-lamella wall that has a maximum depth from the sample surface and a maximum length that defines at least the pre-lamella surface area intended for further TEM analysis. The trench length that is parallel to the maximum length of the pre-lamella then reduces in length as a function of a direction normal to and away from the pre-lamella surface. Furthermore, the depth of the trench decreases as a function of the direction normal to and away from the pre-lamella surface. The slope profile of this change in the trench floor or trench depth can be linear, stepped or curved. This type of trench profile is obtained by maintaining the sample at the 0° tilt angle and utilizing the angled orientation of the FIB column. Subsequent cut-out of the pre-lamella is done without any tilting of the sample.

Figure 4:
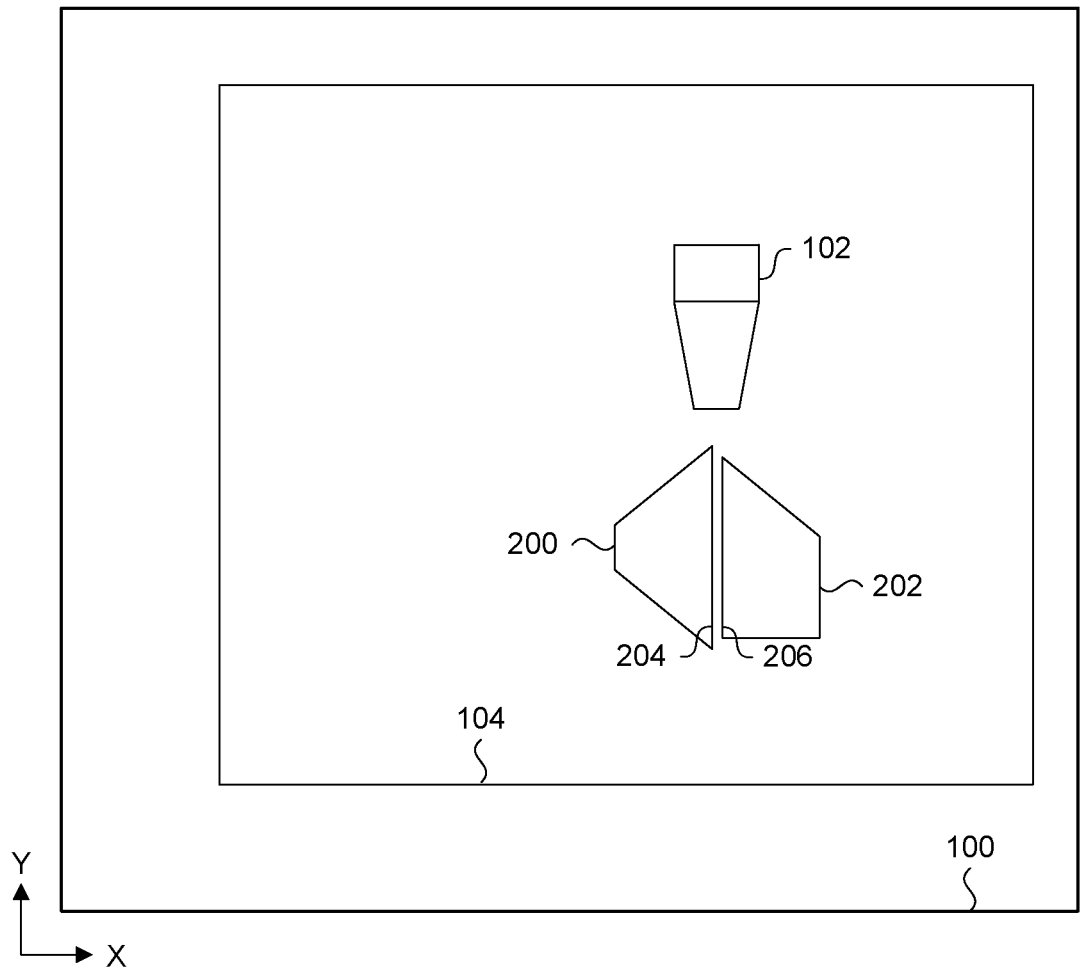
FIG. 4 is a plan view illustration showing asymmetric trenches in a sample for pre-lamella formation within an FIB chamber, according to a present embodiment.

FIG. 4 is a plan view illustration showing asymmetric trenches in a sample for pre-lamella formation within an FIB chamber, according to a present embodiment. This trench milling is executed with the sample 104 and stage 100 set to the default 0° tilt angle within the chamber, where the FIB column 102 that generates the FIB is positioned at some acute angle relative to the sample surface. This angle differs depending on the FIB manufacturer. While not shown, an electron beam column is oriented normal to the stage and sample at the 0° tilt angle. By example, the FIB can be oriented at 36° to the sample surface that is normal to the electron beam column.

Because of this angled orientation, the FIB column 102 is oriented in 3D space which can be defined by a vector having the aforementioned X, Y and Z dimension components, where X and Y are dimensions orthogonal to each other and Z is a height dimension normal to the X and Y dimensions. For the purposes of this discussion, the mentioned vectors are used to indicate direction only and are not intended to express any magnitude component. It should also be understood in this discussion that vectors which are the same have the same direction but can have different starting points.

According to the present embodiments, the pair of asymmetric trenches are milled to have respective pre-lamella walls having an X-Y vector the same as that of the FIB column 102. For example in the embodiment shown in FIG. 4, the FIB column 102 oriented in three dimensional space is defined by vector (X, Y, Z)=(a,b,c). Therefore in the present embodiments, the pre-lamella walls of the pair of asymmetric trenches will each be defined by vector (X, Y)=(a',b') and (a",b") respectively, which are both equal to (a,b) and therefore equal to each other.

In the embodiment of FIG. 4, a first asymmetric trench 200 having a planar trapezoid outline is formed adjacent a second asymmetric trench 202 having a right angled trapezoid outline. It is noted that the outlines are not exact geometric trapezoids, but follow the general outlines shown. The pre-lamella wall 204 of trench 200 is parallel to the pre-lamella wall 206 of trench 202, and both extend along the sample surface with an X-Y vector that is equal to the X-Y vector component of the FIB column 102.

To better illustrate the change in depth and length of the trenches 200 and 202, reference is now made to the example embodiment of FIGS. 5A, 5B, 5C and 5D. Each of these figures shows the first and second asymmetric trenches 200 and 202 with different cross-section lines, and the corresponding cross-sectional view of the sample 104. The shown orientation of the first and second asymmetric trenches 200 and 202 is the same as that in FIG. 4 in relation to the FIB column 102, and the structures are not shown to scale.

Figure 5A:
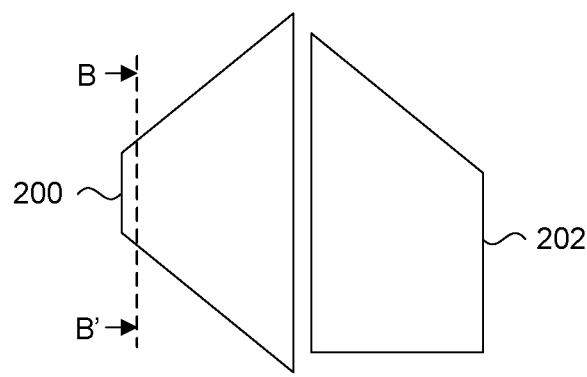
FIG. 5A is a side view illustration of the sample in FIG. 4 taken along cross-section B-B', according to a present embodiment.
Figure 5A:
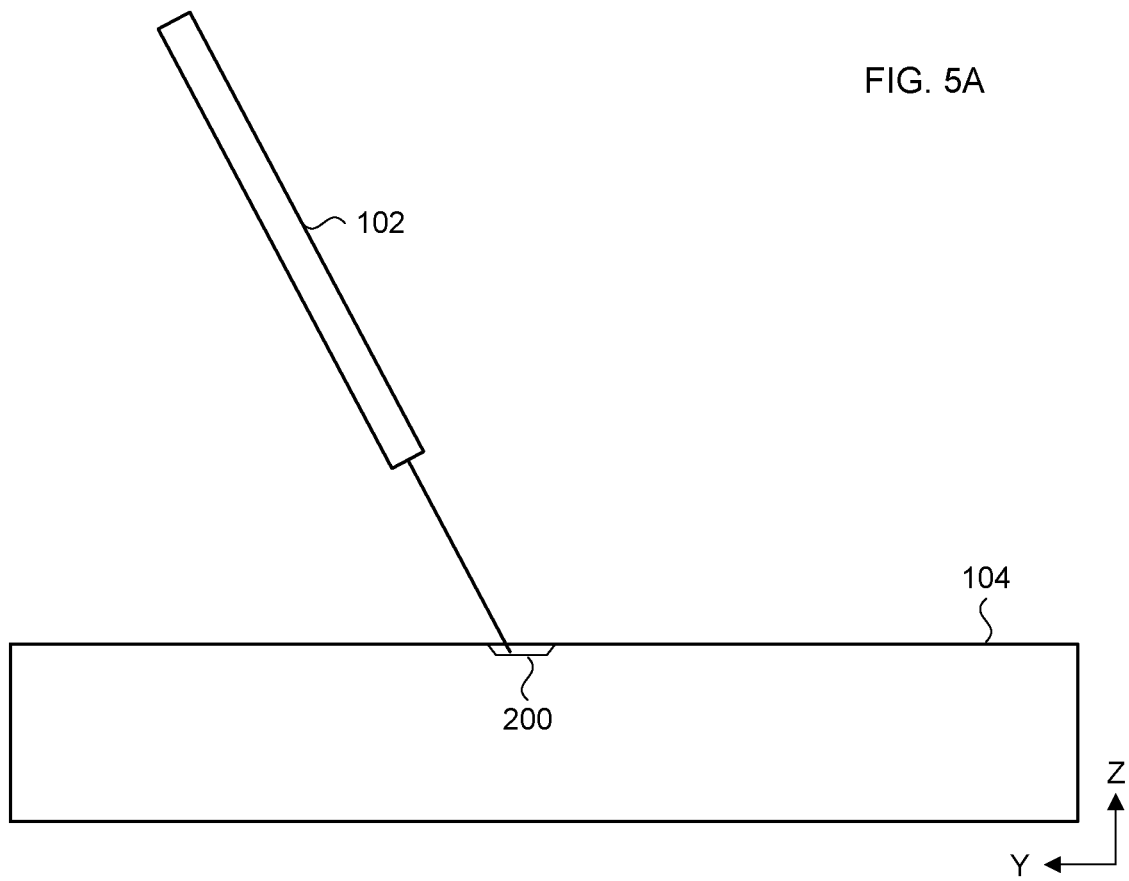

In FIG. 5A, cross-section line B-B' is taken at a part of trench 200 that is relatively shallow after rastering by FIB column 102. It is noted that the left and right side edges can be sloped as well.

Figure 5B:
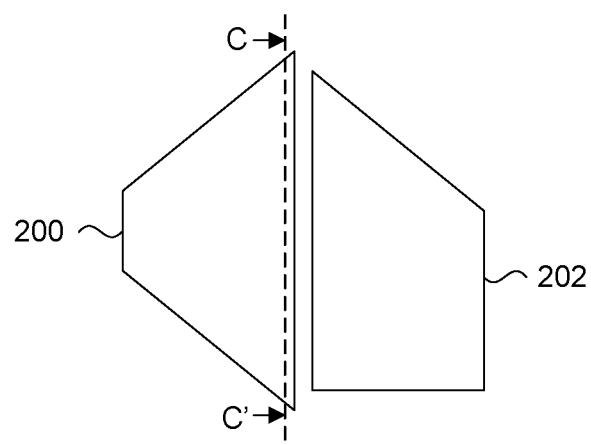
FIG. 5B is a side view illustration of the sample in FIG. 4 taken along cross-section C-C', according to a present embodiment.
Figure 5B:
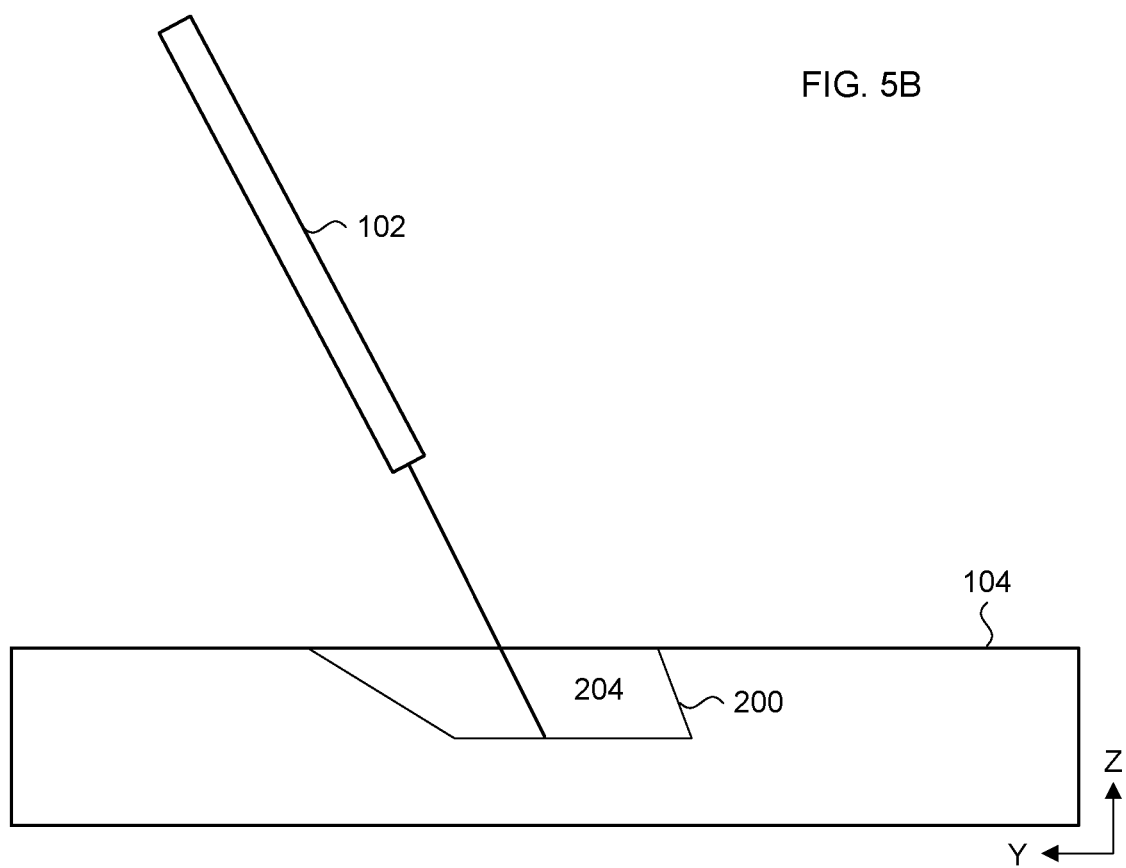

In FIG. 5B, cross-section line C-C' is taken at a part of trench 200 that is close to the maximum depth after rastering by FIB column 102. It is noted here that the bottom of the trench 200 at this position is relatively flat, and the trench wall slopes downwards towards the maximum depth starting from the trapezoid edge closest to the FIB column 102. Therefore in this particular embodiment, the trench depth decreases as a function of the direction normal to and away from the pre-lamella wall 204. Furthermore, the trench length decreases as a function of the direction normal to and away from the pre-lamella wall as the trench length as delineated by the top and bottom edges of the trapezoid.

In this particular example, the trench 200 slopes upward from the pre-lamella wall 204 to the parallel opposite edge of the trapezoid, and slopes upward from the pre-lamella surface to the top and bottom edges of the trapezoid. The purpose for this sloping is described later. Because of the orientation of FIB column 102, there may be undercutting of the sample 104 at the trapezoid edge furthest from the FIB column 102 at this portion of the trench 200. The trench depth is not necessarily constant along any cross-section line parallel to C-C' due to this additional sloping towards the top and bottom edges of the trapezoid. However, the trench depth on any point along any cross-section line parallel to C-C' generally decreases the further away it is from the pre-lamella wall 204. By this point of the milling process, the pre-lamella wall 204 of trench 200 is exposed and has an overall area larger than the desired TEM analysis area, which is typically rectangular in shape.

In the cross-section profile of the trench 200 in FIG. 5B, the left side sloping edge can be the same as the native angle of the FIB column 102, or greater relative to an SEM normal to the stage at 0° tilt as shown in FIG. 5B. The particular angle chosen depends on the shape of the pre-lamella wall 204 that is to be exposed.

Figure 5C:
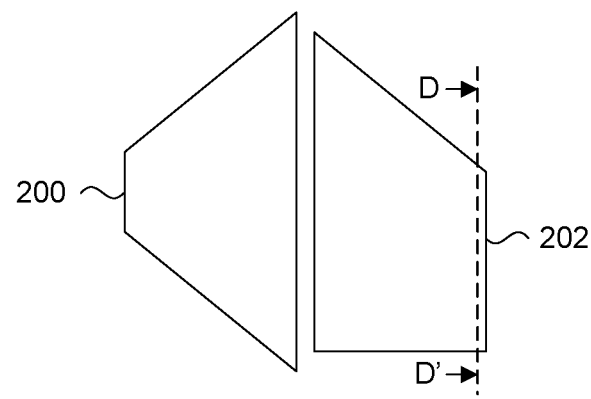
FIG. 5C is a side view illustration of the sample in FIG. 4 taken along cross-section D-D', according to a present embodiment.
Figure 5C:
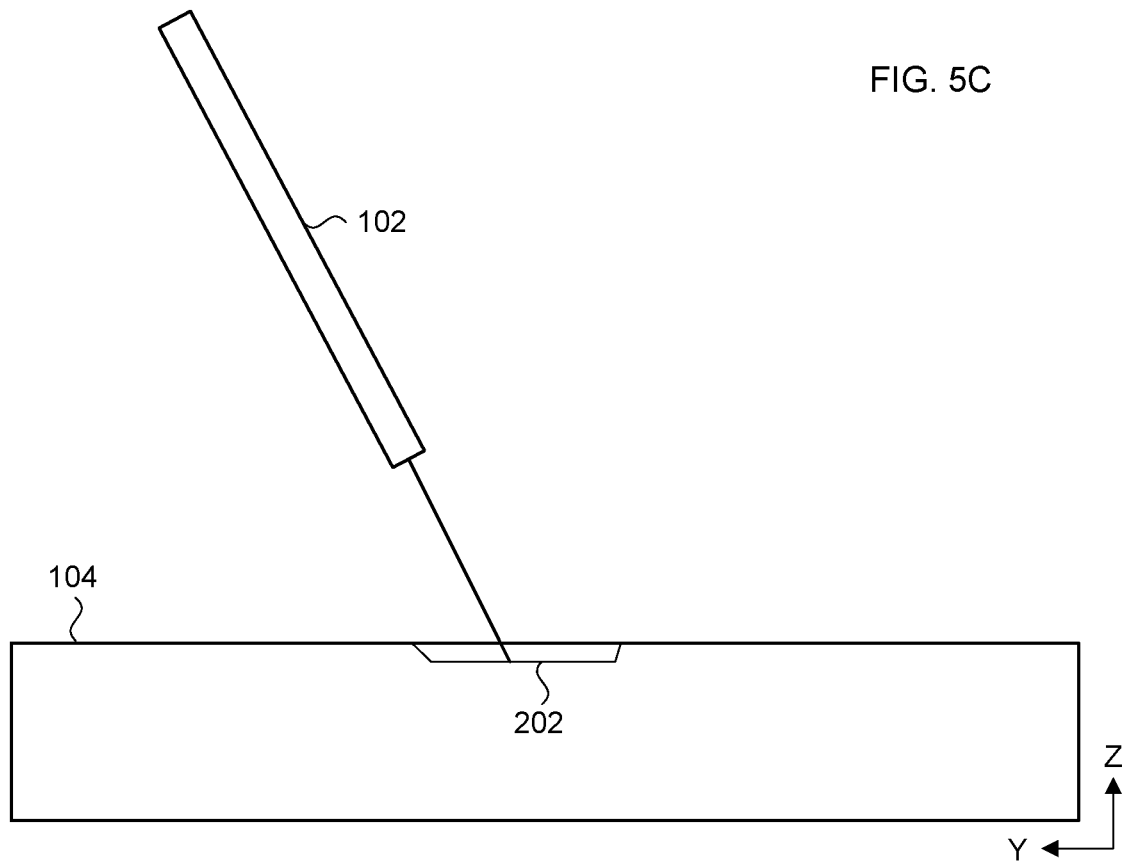

In FIG. 5C, cross-section line D-D' is taken at a part of trench 202 that is relatively shallow after rastering by FIB column 102. It is noted that the left and right side edges can be sloped as well.

In FIG. 5D, cross-section line E-E' is taken at a part of trench 202 that is close to the maximum depth after rastering by FIB column 102. It is noted here that the bottom of the trench 202 at this position is relatively flat, and the trench wall slopes downwards towards the maximum depth starting from the trapezoid edge closest to the FIB column 102. Therefore in this particular embodiment, the trench depth decreases as a function of the direction normal to and away from the pre-lamella wall 206. Furthermore, the trench length decreases as a function of the direction normal to and away from the pre-lamella wall as the trench length as delineated by the top and bottom edges of the trapezoid.

In this particular embodiment, the trench 202 slopes upward from the pre-lamella wall 206 to the parallel opposite edge of the trapezoid, and slopes upward from the pre-lamella surface to the top edge of the trapezoid. The purpose for this sloping is described later. Because of the orientation of FIB column 102, there may be undercutting of the sample 104 at the trapezoid edge furthest from the FIB column 102 at this portion of the trench 202. The trench depth is not necessarily constant along any cross-section line parallel to E-E' due to this additional sloping towards the top edge of the trapezoid. However, the trench depth on any point along any cross-section line parallel to C-C' generally decreases the further away it is from the pre-lamella wall 206. By this point of the milling process, the pre-lamella wall 206 of trench 202 is exposed and has an overall area larger than the desired TEM analysis area, which is typically rectangular in shape.

In the cross-section profile of the trench 202 in FIG. 5D, the left side sloping edge can be the same as the native angle of the FIB column 102, or greater relative to an SEM normal to the stage at 0° tilt as shown in FIG. 5D. The particular angle chosen depends on the shape of the pre-lamella wall 206 that is to be exposed. The desired TEM analysis, which is cut out later, will have a maximum area following the profile of the trench about E-E'. Any person skilled in the art should understand that a smaller area can be cut out.

Hence it is important to note that the length of pre-lamella wall 206 is shorter than the length/depth of pre-lamella wall 204 of trench 200. Furthermore, the maximum depth of the trench at pre-lamella wall 204 of trench 200 can be greater than the maximum depth of the trench at pre-lamella wall 206 of trench 202. This is to facilitate later cut out of the pre-lamella by the FIB column 102 as targeting any side and bottom edges of the exposed pre-lamella wall 206 will result in full cut out.

Figure 6:
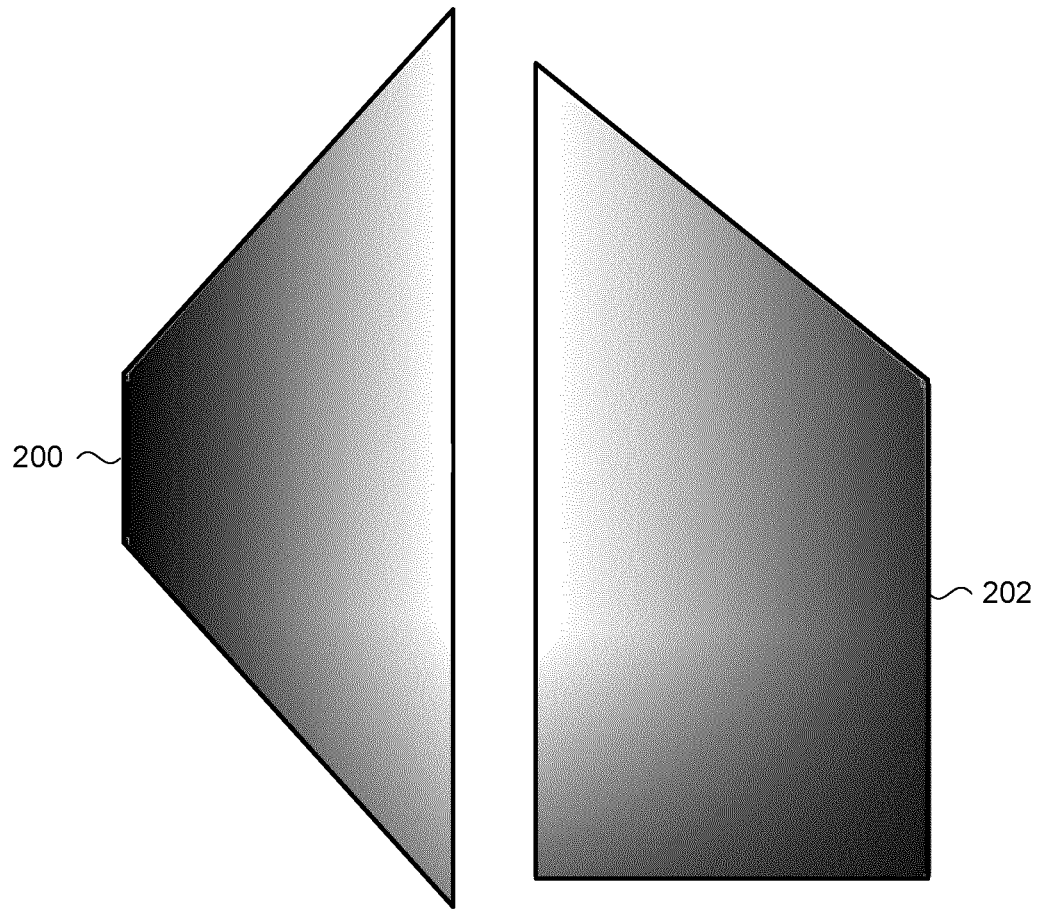
FIG. 6 is an illustration of the asymmetric trenches of FIG. 4 showing variation in applied dose during milling, according to a present embodiment.

FIG. 6 is an enlarged diagram of the asymmetric trenches 200 and 202 with shading to illustrate the variation in applied dose, where the darkest shading (black) generally results in the shallowest depth, the lightest shading (white) generally results in the deepest depth, and with the gray shade transition from black to white showing this variation of applied dose that results in a gradient of the trench. The presently shown grayscale variation results in trenches with a three-dimensional profile gradient. Those skilled in the art will recognize such a gradient can be created by varying the dose, dwell time, or even spacing of the CPB. The specific sloping profile from the edges of the trapezoid outline to the pre-lamella wall for trench 200 is not important. For trench 202, the slope should be at a minimum level to provide sufficient line of sight for the FIB column 102 when the sample is rotated close to 90° counterclockwise with 0° stage tilt so that cut out of the side and bottom edges of the pre-lamella by the FIB is unobstructed by parts of the remaining trench surface.

Persons of skill in the art will understand that various parameters of the FIB can be controlled to obtain the minimum required slope based on the particular FIB column 102 orientation of the system. Additionally, the slope of the trench does not have to be linear, and can be curved (concave) or configured as a series of steps with gradually changing heights.

Ultimately, the purpose of the sloping of the trench floor and the outline shape of the trenches is to minimize the time required to mill material from the sample in order to form the pre-lamella, which contributes to the improved throughput for pre-lamella formation and cut out in a sample.

The previously shown embodiments of the asymmetric trenches 200 and 202 are examples only, meaning that the trapezoidal shapes and the trench profiles are merely one example that requires significantly less time than the standard design that utilizes a pair of rectangular trenches as shown in FIG. 2 in order to obtain a pre-lamella having about the same size. Any outline shape for the asymmetric trenches 200 and 202 can be used with any combination of trench profiles, provided that when the stage is rotated the FIB has an unobstructed line of sight to cut through the bottom and sides of the pre-lamella attached to the sample for subsequent mechanical lift out.

To that end, following is a description of a method for using the previously described asymmetric trenches to prepare a cross-section lamella for further analysis, such as TEM analysis by example.

Figure 7:
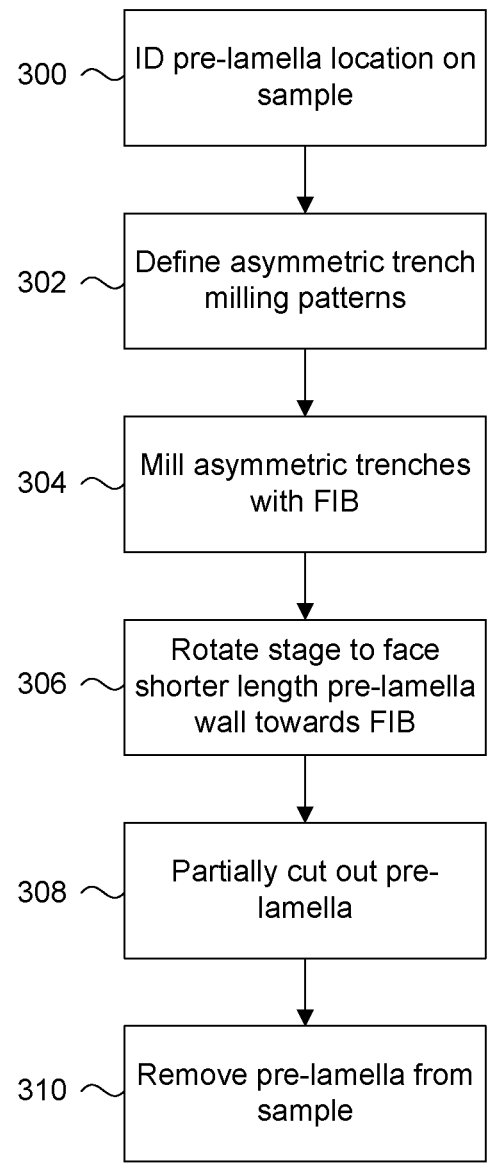
FIG. 7 is a flow chart of a pre-lamella preparation method, according to a present embodiment.

FIG. 7 is a flowchart outlining a method for cross-section sample preparation, according to a present embodiment. References also made to the sequence of FIGS. 8A-8G, which are successive top view images of the surface of the sample that help illustrate the presently described sample preparation embodiment. In this example, the pre-lamella size is about 30 μm wide×10 μm tall, into a six metal Al+W IC bond pad with glass ILD, with the desired thickness of about 1 μm.

Figure 8A:
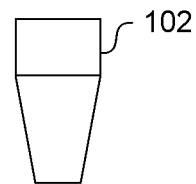
FIGS. 8A-8F are successive images illustrating the presently described sample preparation method embodiment of FIG. 7.
Figure 8A:
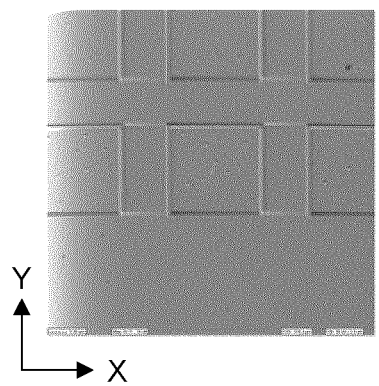
Figure 8B:
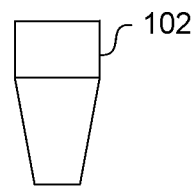
Figure 8B:
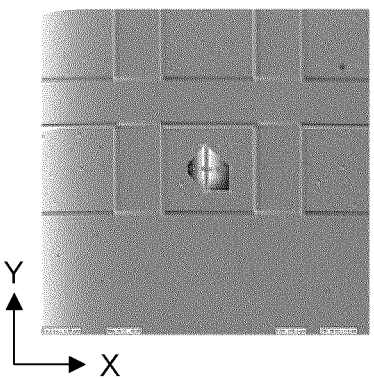

It is assumed in the presently shown example that the sample is secured to stage 100 of FIG. 4, with the orientation of the FIB column 102 as shown in FIG. 4 and a 0° tilt angle of the stage. The method starts at 300 were a desired location for a pre-lamella of the sample is to be formed is chosen. This may include rotation of the stage in order to obtain the desired cross-section area. As shown in FIG. 8A, the sample is positioned relative to the FIB column 102. Next at 302, a pair of milling patterns are defined on the identified location from FIG. 8A. In the present example shown in FIG. 8B, these milling patterns have the same trapezoid shapes as shown in FIG. 4. From this orientation of the sample relative to the FIB column 102, the desired pre-lamella walls will have an X-Y vector equal to that of the FIB column 102. An optional protective coating can be applied to the identified site before or after step 302.

Figure 8C:
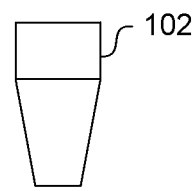
Figure 8C:
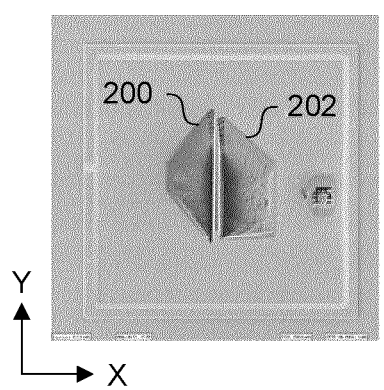
Figure 8D:
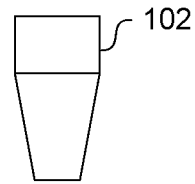
Figure 8D:
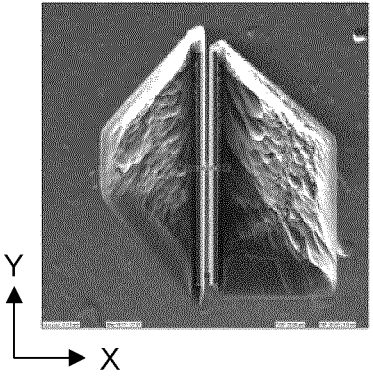

Following at 304, the asymmetric trenches are milled to have the sloping surfaces within the trapezoidal outlines as previously described. FIG. 8C shows the resulting finished trenches 200 and 202 after FIB milling. FIG. 8D shows the definition of further areas to mill to both sides of the pre-lamella as part of an optional polishing step. In this example, a 3 nA Ga ion beam is used to clean and reduce the pre-lamella width, and adds an extra 2 minutes per side of the pre-lamella. This step is optional because the pre-lamella may be polished later on.

Figure 8E:
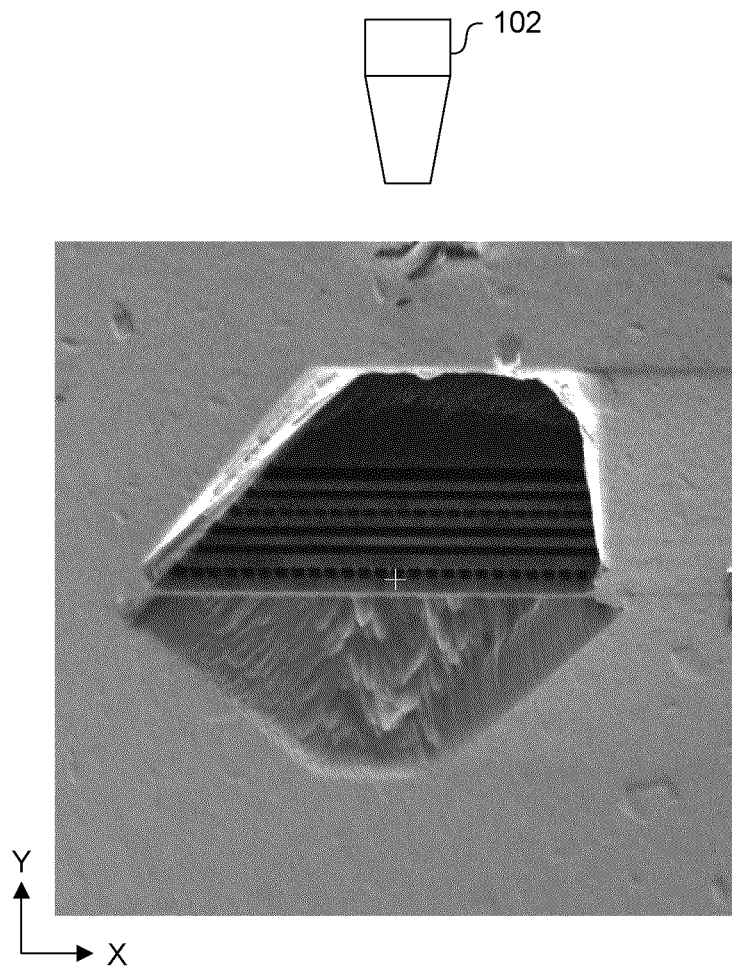

At this point in the process, milling of the trenches has completed and the pre-lamella has been formed but is still attached at its bottom side and at its ends to the sample. Now the pre-lamella cut out process can begin at step 306 by rotating the stage such that the right side trench having the shorter length pre-lamella wall that was milled in FIG. 8C has its pre-lamella wall facing the FIB column 102. This is shown in FIG. 8E.

It is important to note in this example embodiment that there is no tilt applied to the stage such that the stage remains normal to the electron beam column during the entire process. In an alternate embodiment, a small tilt, typically a few degrees, can be applied to the stage prior to step 306 to facilitate a more uniform or smooth surface as is sometimes performed to reduce curtaining or improve parallelism.

The stage can therefore be rotated 90° counterclockwise, or 270° clockwise, however a 90° counterclockwise rotation would take less time to execute. The rotation does not necessarily need to be exactly 90° counterclockwise, or 270° relative to its current position. The rotation is sufficient if the FIB can be deflected to make the necessary cuts to the bottom and sides of the pre-lamella.

In a further alternate embodiment, the asymmetric trenches 200 and 202 shown in FIG. 4 can be offset with respect to each other in the Y-direction, or in a direction parallel to the long axis of the intended pre-lamella. This amount of offset will determine the minimum amount of rotation for the stage that still provides line of sight to the FIB for cutting the bottom and sides of the pre-lamella. For example, if the trench 202 shown in FIG. 4 is shifted in upwards in the Y direction, then the stage only needs to be rotated less than a full 90° counterclockwise and by a minimum degree of rotation such that the FIB has line of sight to cut through the bottom and sides of the pre-lamella. For this to work properly, the trench 202 would have a gradient or slope configuration to provide this line of sight to the FIB once the stage has been rotated to this minimum degree of rotation.

Figure 8F:
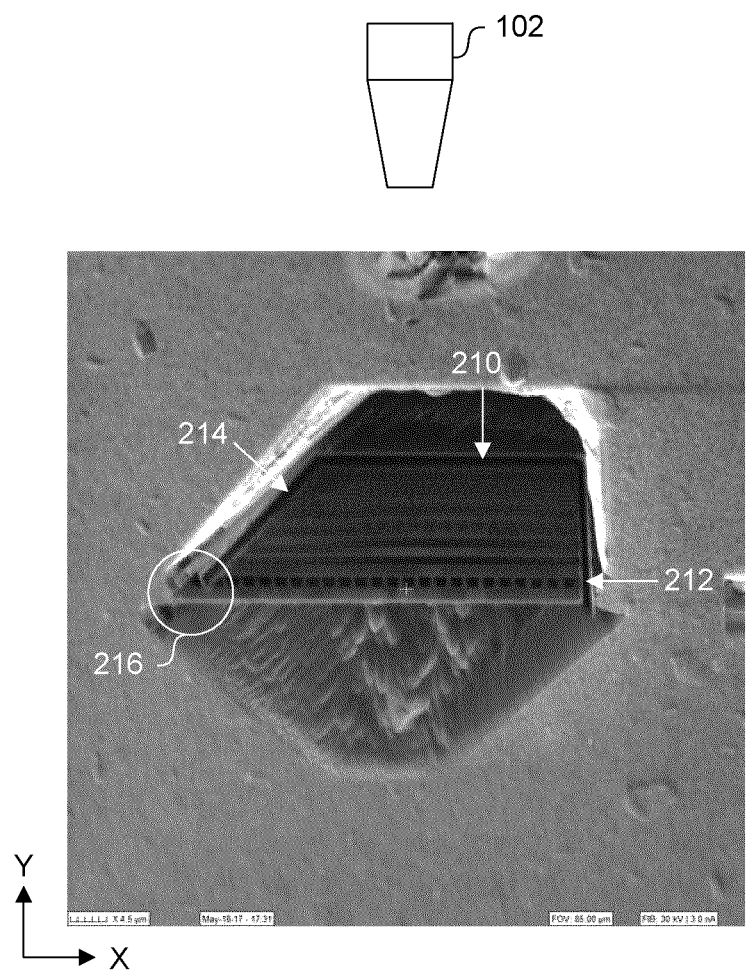

Finally at 308 the pre-lamella is either fully or partially cut out, if partially such that only a small portion of the pre-lamella remains attached to the sample. When fully cut out, the pre-lamella is allowed to fall into the trench and is removed later. In the present embodiment and orientation as shown in FIG. 8F, the FIB is controlled to cut through the entire thickness of the pre-lamella at the bottom 210, as well as the entire right side 212. On the left side of the image, most of the left side 214 of the pre-lamella is cut through by the FIB except for a small connection 216 (circled) to the sample which is retained. In the presently shown example of FIG. 8F, a top edge of the pre-lamella remains connected to the sample. In alternate embodiments, any portion of the angled left side 214 can remain attached to the sample as connection 216. In the present example, a 3 nA Ga ion beam with 5 nC/μm² dose was used. The cut width is <2 μm, and the time to complete the cuts shown in FIG. 8F requires about 2 minutes.

As previously discussed, pre-lamella wall 204 is longer and deeper than pre-lamella wall 206. This means that there is very little to no bulk material behind the pre-lamella wall 206. Accordingly when the FIB cuts, there will be no material securing the pre-lamella to the bulk material, except for connection 216 where the FIB cutting is intentionally stopped.

Figure 9:
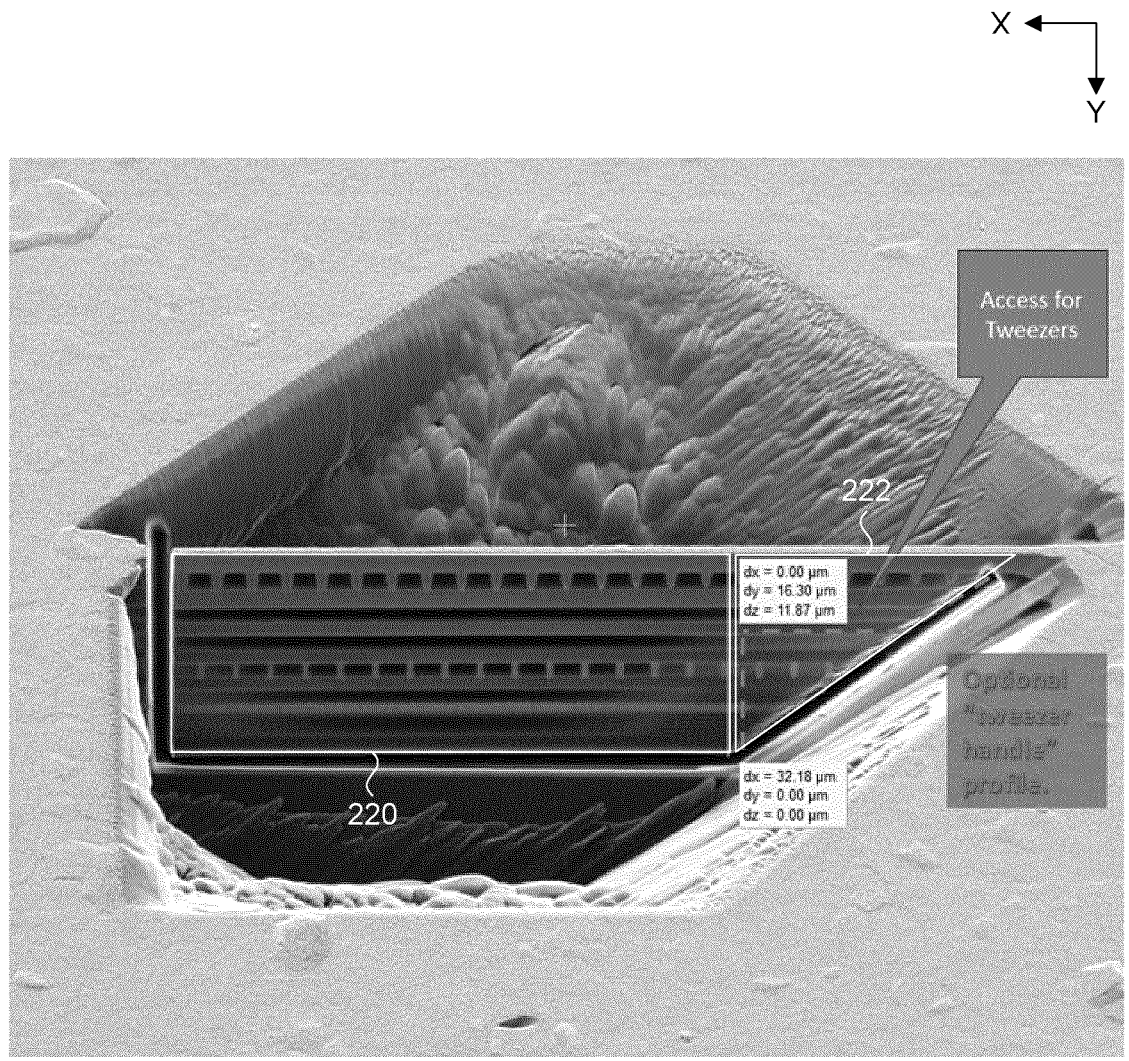
FIG. 9 is an enlarged image of FIG. 8F to better show the structure of the formed pre-lamella prior to removal.

Previously shown FIG. 8E and FIG. 8F appear inverted, or upside down in orientation, due to the perspective of the image being taken. These images have been arranged to show the orientation of the asymmetric trenches relative to the FIB column 102. FIG. 9 presents a higher magnification view of FIG. 8F as if viewed from the perspective of the FIB column 102 after the partial cut out step 308. The pre-lamella has a straight bottom edge and an upper sloping right edge. The uncut portion of the pre-lamella that is still attached to the sample should clearly be seen. This resulting pre-lamella has two regions. First is the analysis area 220 outlined by a white box in FIG. 9, and second is the handle area 222 outlined by a white triangle.

The analysis area 220 is the region of interest for subsequent analysis, such as for TEM analysis by example, where the entire area 220 is relevant and should not be damaged or contaminated in any way. In contrast, the handle area 222 can be treated as a discard region which can be used for gripping by a micro-tweezer, or attachment to a lift out needle. Having a large area for the tweezers to grip requires less precision for positioning of the tweezers and results in quicker lift out of the pre-lamella. If a lift out needle is to be used, then it can be attached to this handle area 222 prior to step 308. Then the subsequent cut out step 308 can have the entire sides and bottom of the pre-lamella cut out without the need for retaining the small connection 216 to the sample. Alternately, the list out needle can be used after step 308.

After step 308, the sample preparation is now complete and the pre-lamella is removed from the sample at 310. And the previously mentioned micro-tweezers or any other known technique, can be used for mechanically removing the pre-lamella from the sample. The pre-lamella can now be attached to another part of the sample, or to another carrier that may be positioned on the stage using any of the previously disclosed or known techniques. A new redeposition technique for attachment of a list out needle to a sample or the presently described pre-lamella is described later.

An immediate advantage of not needing to tilt the sample for cutting out the pre-lamella is improved accuracy and reduced time for manipulating the stage. The removed pre-lamella can easily be shifted over in the X-Y plane of the stage to the other position on the sample or to another carrier on the stage and attached in the same Z dimension orientation that it was originally formed relative to the sample.

Following are results of an experimental comparison between the prior art technique of forming a pre-lamella using the rectangular trenches 106 and 108 shown in FIG. 2 versus the presently described method of FIG. 7. By example, the 2 prior art rectangular milling outlines 106 and 108 are approximately 24 μm×48 μm in size. Assuming that a 25 nA beam with 20 nC/μmt² dose, the total time to mill both rectangular trenches to a predetermined depth is about 35 minutes.

On the other hand, the 2 asymmetric trenches 200 and 202 having the shown trapezoidal outlines occupy an area of 24 μm×48 μm and have a sloped 3D profile gradient where the left side trench 200 has a gradient that increases in depth from the left side to the right, while the right side trench 202 has a gradient that increases in depth from the right side to the left. In this example, a 25 nA beam with a maximum dose of 20 nC and 15 nC/μm² dose is used, to complete the milling of the trenches in about 12 minutes, the shallower trench being milled with the lower dose, both trenches having a non-uniform dose profile which yields a desired gradient. While the same pre-lamella is formed, the amount of time required using the presently described embodiments is significantly reduced. It is also observed that this comparison excludes the fact that time is required in the prior art technique to tilt the stage, which is not required in the method of the present embodiments.

In the previously described example embodiments, the first pre-lamella wall has a length that completely overlaps the second pre-lamella wall. Also, the depth of the first pre-lamella wall is greater than that of the second pre-lamella wall along the entire length of the first pre-lamella wall. Therefore the entire area defined by the second pre-lamella wall is the resulting pre-lamella cut out of the sample. Therefore rotation of the stage/sample counter-clockwise by approximately 90° is suited for cut out by the FIB as this will maximize the area of the pre-lamella sample which is defined by the area of the second pre-lamella wall.

According to an alternate embodiment, the trenches 200 and 202 shown in FIG. 4 can be shifted in the Y-direction to reduce the amount of counterclockwise rotation of the sample 104. By example, trench 200 can be shifted upwards relative to its currently shown position in FIG. 4, or the trench 202 can be shifted downwards relative to its currently shown position in FIG. 4. The resulting overlapping portions of the first pre-lamella wall 204 and the second pre-lamella wall 206 then forms the resulting pre-lamella cut out of the sample 104. In this alternate embodiment, the sample 104 is rotated just enough to give line of sight from the FIB to the same bottom and sides of the second pre-lamella wall 206 as seen in FIG. 9. However, the cut to the left vertical side of the second pre-lamella wall would be at a location where the trench 200 has been milled on the opposite side thereof. The trench profiles can be adjusted to minimize milling time while ensuring that the FIB has the aforementioned line of sight to perform cut out.

In summary, the presently described sample preparation embodiment has a sample oriented normal to an SEM/GFIS column or other imaging column (including a light microscope) via a stage, and is operated upon by an FIB to form the pre-lamella slice within the sample, followed by a simple 90° rotation with no tilt of the stage for cut out by the FIB.

It is noted that further refinements are possible to further reduce the overall sample preparation time discussed in the present embodiments. By example, rough cut shapes can be further modified in both outline shape and 3D profile to reduce milling time by an additional 10%-20%. A holder with a slight pre-tilt orthogonal or normal to the tilt axis, in combination with a modified patterning shape angle, may allow for imaging of the cross-sectioned face at an oblique/glancing angle. A straightforward refinement of the steps discussed above can be used to fabricate an "inverted barn" or similar structure suitable for plan-view analysis or lamella preparation (see the use case for an "inverted barn" pre-lamella as described in Phaneuf, M. W. and Patterson, R. J., Site-specific TEM Specimen Preparation of Grain Boundary Corrosion in Nickel-Based Alloys Using the FIB "Plan-View Lift-Out" Technique, Microscopy and Microanalysis, August 2002, vol. 8, pp. 1266-1267.)

Now that the pre-lamella has been formed and cut out from the sample, the pre-lamella can be attached to a TEM carrier grid. Pre-fabricated carrier grids are well known in the art of transmission electron microscopy (TEM) specimen preparation, and are often fabricated through metal stamping or silicon processing technologies. Such carrier grids are used to hold a sample that has been previously prepared, which itself is designed to be held within a holder of the transmission electron microscope chamber.

Figure 10:
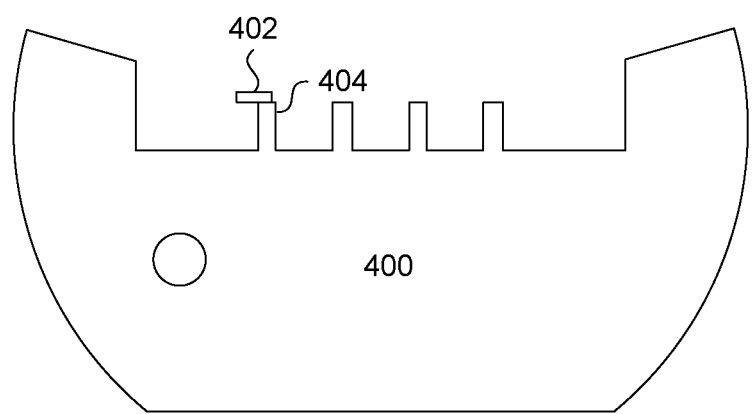
FIG. 10 shows a sample carrier grid with a sample attached using a gas-less redeposition method.

FIG. 10 shows an example carrier grid 400 where the previously formed pre-lamella 402 is attached to one of the posts 404 of the carrier grid 400. Such a post can be referred to as a carrier substrate. According to the following embodiments, the pre-lamella 402 is attached to the post in the absence of gas-assisted material deposition. This same technique can be used in the method of FIG. 7 to attach a lift out needle to the handle area 222 of the pre-lamella if a micro-tweezer is not available. The gas-less redeposition method has been fully described in commonly owned PCT publication number WO2007082380A1 titled "Redeposition technique for membrane attachment", filed on Jan. 19, 2007 and claiming priority to U.S. provisional patent application No. 60/759,960 filed on Jan. 19, 2006, which is herein incorporated by reference.

An advantage of the present gas-less attachment method is that the FIB system chamber and its contents are never exposed to undesirable contaminants which may come from gas which is typically used for attaching a micro-object to a substrate or carrier grid. Another advantage is there is no longer the need to insert and retract a gas injection nozzle in the FIB system chamber, thereby avoiding vibrations and the risk of damage to the sample.

This method can be used to secure any type of micro-object to any type of material. For example, such micro-objects can include specimens obtained from host materials through milling or cleaving or any other suitable means. Micro-objects other than pre-lamellas can also include, for example, portions of semiconductor devices, biological specimens and MEMS devices. The material to which the micro-object is secured can include, for example, semiconductors, dielectrics or metals.

Figure 11:
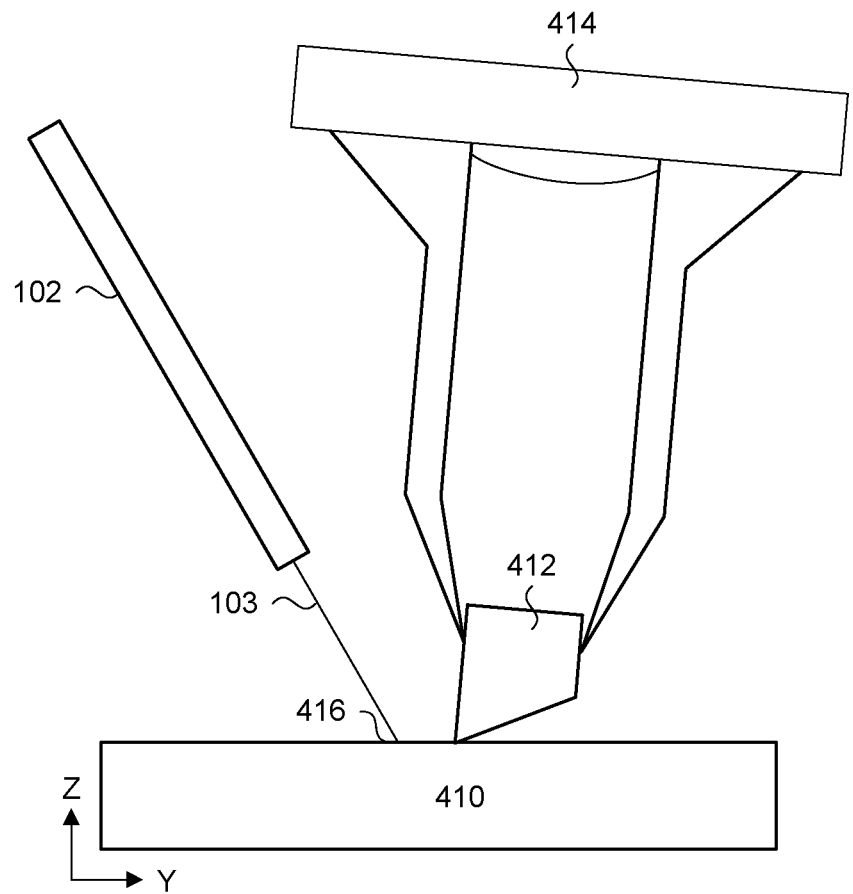
FIG. 11 is an illustration of attaching of a sample to a substrate by the gas-less redeposition method of the prior art.

The present gas-less attachment method is now described starting with reference to FIG. 11.

FIG. 11 shows a carrier grid substrate 410 onto which a specimen 412 has been placed and held in position by a micro-tweezer 414. The specimen 412 is positioned downstream of the FIB direction. The substrate 410 can be, for example, a TEM grid. Once the specimen 412 is in place, the FIB column 102 and FIB mill-out a target area 416 on the sample 410, thereby causing material from the substrate 410 to sputter off the substrate 410 and redeposit over the base of the specimen 412 and on the substrate 410, but mostly in the target area 416. This redeposition of substrate material over the specimen 412 and the substrate 410 causes a binding or attachment of the specimen 412 to the substrate 410, thereby binding the specimen 412 to the substrate 410. Once the specimen 412 is secured to the substrate 410, the micro-tweezer 414 releases the specimen 412. Alternatively, the specimen 412 can be placed on the substrate 410 and released by the micro-tweezer 414 before being secured to the substrate 410 if the specimen geometry and physical properties allow it.

Figure 12:
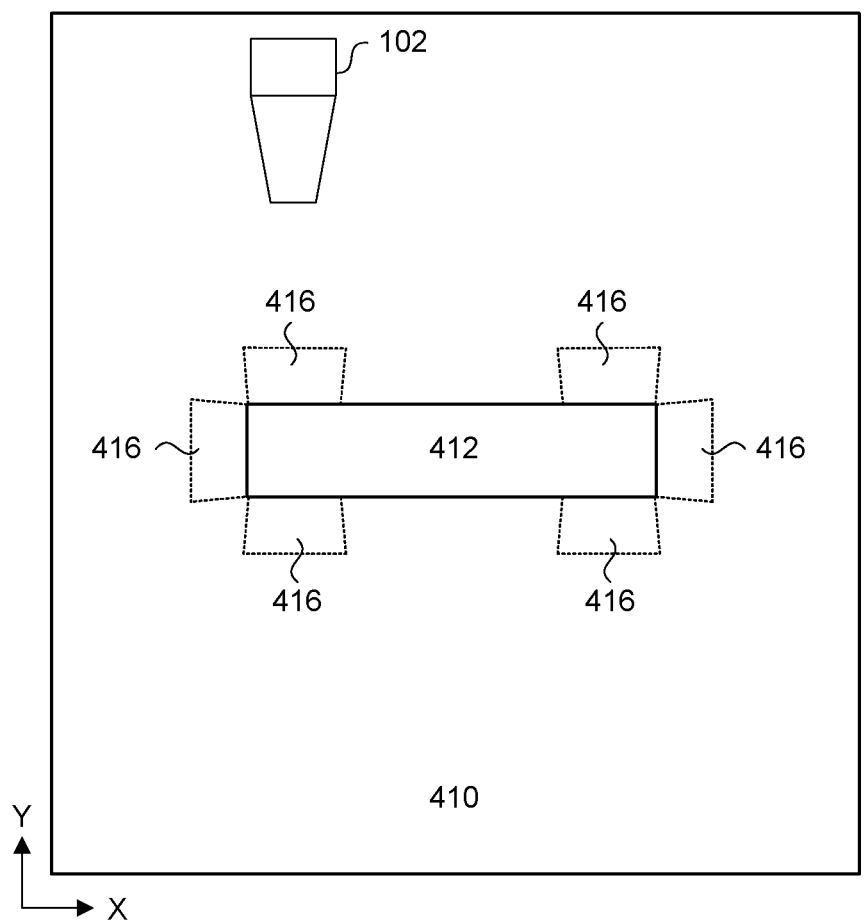
FIG. 12 shows the top view of the substrate of FIG. 11 with the sample attached thereto by the gas-less redeposition method of the prior art.

While FIG. 11 shows a side view of the specimen 412 and substrate 410, FIG. 12 shows a top view of the specimen 412 secured to the substrate 410 at six target areas 416. As will be understood by the skilled worker, any number of target areas 416 can be used. In the presently shown example, specimen 412 is elongate and the chosen target areas 416 surround the ends of specimen 412. Because of the top-down orientation of the FIB column 102 the substrate 410 does not require any rotation as sufficient redeposition of material will occur to bind the specimen 412 the substrate 410. Depending on the geometry, the mass, the composition of the specimen 412 and of the substrate 410, the number of target areas 416 where the specimen 412 is bound to the substrate 410 will vary.

Figure 13:
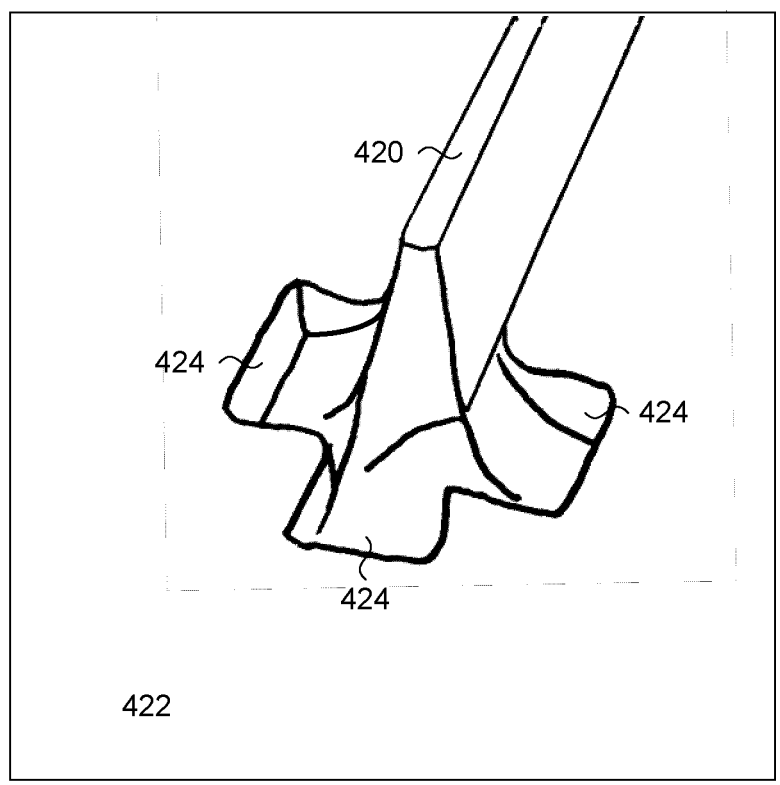
FIG. 13 is an illustration showing details of one end of the sample of FIG. 12 attached to the substrate.

FIG. 13 is a line based perspective image of an actual silicon specimen 420 secured to a silicon substrate 422 at three target areas 424, where the specimen 420 is similar in shape to specimen 412 shown in FIG. 12. As can be seen in FIG. 13, the target areas 424 appear as trenches after milling, and the sputtered material of the substrate 422 covers the base of the specimen 412. While the present example of FIG. 13 shows silicon substrate material being used, other substrate materials such as, for example copper, molybdenum, boron or boron carbide can be used depending on the analysis application.

Experiments have shown that redeposition rates may be higher when millings insulators such as, for example, silicon dioxide. Accordingly there are advantages to using a substrate having a conductive region where the specimen can be placed, the conductive region being next to an insulating region of the substrate that can be milled in target areas to produce high redeposition rates.

Experiments have also shown that starting the milling process close to the specimen and ending farther away maximizes the redeposition rate. That is, the edge of the target area where the milling process finishes is the edge furthest from the specimen.

In order to get proper redeposited material, a suitable substrate material should be used. Although adequate rastering (milling) parameters can be found for practically any type of substrate to get sufficient amounts of redeposited material, there are particular advantages to rastering with long dwell times, typically, although not exclusively, in excess of 50 μs per dwell point. Furthermore, certain materials may respond favorably to asymmetric raster spacing, i.e., where the FIB is moved a different distance between the dwell points in a given line as compared to the spacing between consecutive lines. Still further, those skilled in the art will realize that more favorable redeposition conditions can be achieved by varying the angle of incidence of the FIB relative to the substrate material.

Additionally, depending on the grid material, it can be advantageous to deliver the entire desired ion dose in a single raster pass so as to maximize redeposition. Using a single raster pass also reduces the removal of some of the redeposited material which can occur when scanning the same area multiple times.

It is noted that the typical short dwell time (less than 10 μs) "default" milling parameters that typically are programmed into FIB systems by the manufacturer produce very little redeposited material and do not produce that material in a "directional" fashion where it can be made to redeposit on the desired location at the specimen edge or base. Long dwell times and selection of the direction of milling away from the membrane, as discussed above, produce an optimal amount of redeposition in a short period of time and at the desired location.

Therefore, this method for attachment is suited for use in the method of FIG. 6 where a lift out needle can be positioned on the top surface of the handle area 222 of a pre-lamella 402 (i.e. as shown in FIG. 9) followed by rastering of the FIB at suitable target areas to redeposit the pre-lamella substrate material onto the needle, thereby binding both together. A similar process can be executed to attach the bottom surface of the removed pre-lamella 402 to the post 404 of the carrier grid 400 shown in FIG. 10.

Figure 14:
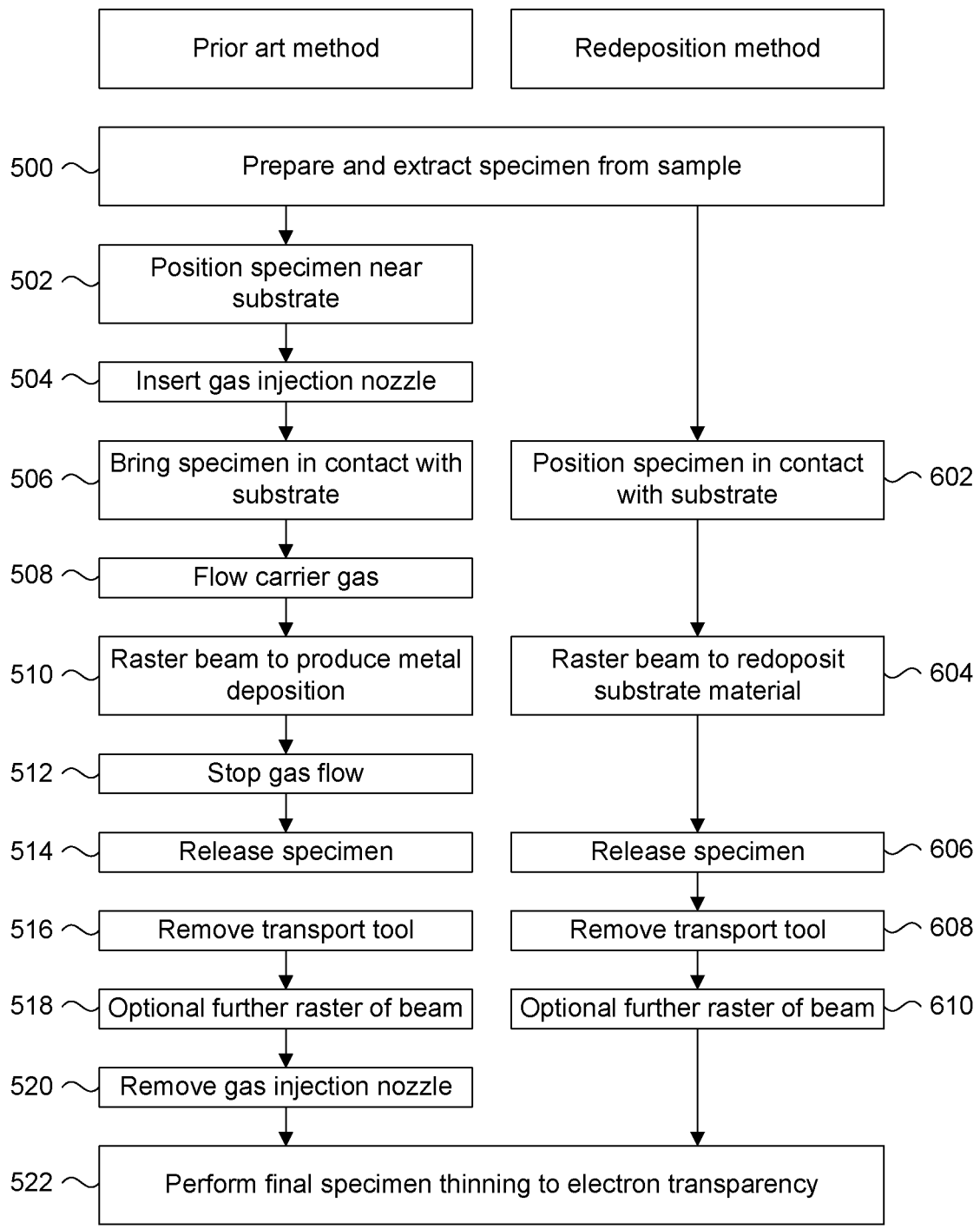
FIG. 14 is a comparison between a gas-assisted method of securing a sample to a substrate and the gas-less redeposition method.

FIG. 14 shows a comparative flow chart for a gas-assisted method of securing a specimen to a substrate and the previously described gas-less method. The gas-assisted method is first described as follows. A specimen is prepared and extracted from a sample at 500. This can be the preparation of a pre-lamella as outlined in the method of FIG. 7 by example. At 502, the specimen is assumed to be moved by a transport tool, such as micro-tweezers and positioned near the substrate. Then a gas injection nozzle is inserted into the FIB chamber at 504 followed by bringing the specimen in contact with the substrate at 506. The carrier gas is flowed from the gas injection nozzle at 508, and then the FIB is rastered at 510 to produce metal deposition that attaches the specimen to the substrate. Once the requisite amount of rastering has been completed, the gas flow is stopped at 512 and the specimen is released by the transport tool at 514. The transport tool is removed at 516 and if required, optional further rastering of the beam can be executed to produce metal deposition and further attach the sample to the substrate at 518. Finally the gas injection nozzle is removed at 520 and any final specimen thinning is executed at 522.

Now the gas-less redeposition method is described. It is assumed that the same step 500 has already been executed for preparing and extracting the specimen from the sample. Using a transport tool, the specimen is placed in contact with the substrate at 602. Then in the absence of any gas, the FIB is rastered at least in one target area of the substrate at 604 to redeposit the substrate material to attach the sample to the substrate. The specimen is then released at 606 and the transport tool is removed at 608. If required, optional further rastering of the FIB at the same target area(s) or new target areas can be executed at 610 to redeposit further material onto the specimen and substrate. The same final specimen thinning is executed at 522.

The advantage of the present method is clearly advantageous in terms of the reduced number of method steps relative to the gas-assisted method.

Therefore, the gas-less redeposition method is well suited for attaching the extracted pre-lamella of the previously described embodiments in the absence of a gas-assisted metal deposition and thus, not exposing the FIB system chamber and its contents to undesirable contaminants. Further, the gas-less redeposition method removes the need to insert and retract a gas injection nozzle in the FIB system chamber, thereby avoiding vibrations and the risk of damage to the sample. Still further, the method can utilize well developed art for manipulating the specimen without the need of a friction or force fit mechanical attachment that can damage the lamella.

One significant advantage of the above described gas-less redeposition method is the absence of any gas delivery system. However, there may be applications where some gas is still required, such as in cryo-FIB applications by example, where the gas flow from a full deposition injector system as is known in the prior art can overwhelm the sample and force it out of cryo conditions, yet a small volume of gas, locally applied, can have advantages.

Additionally, the cumbersome nature of inserting and withdrawing a gas delivery nozzle requires additional time in the prior art method outlined in FIG. 14, and the risk of impact damage to the specimen and the carrier grid is relatively high as the gas nozzle must be positioned a few hundreds of microns above the area between the specimen and the carrier grid substrate. This problem becomes more significant when a very thin and fragile pre-lamella 402 must be attached to a post 404 of a carrier grid 400 as shown in FIG. 10.

Therefore according to a present embodiment, a new TEM carrier grid is described which has an integrated gas delivery system to obviate the need for an external gas nozzle.

More specifically, the novel carrier grid of the present embodiments has a reservoir formed in the body thereof that stores a gas of any type that would be delivered by the gas delivery nozzle of the prior art for a particular application. A channel extends from the reservoir into a post where the end of the channel is closed off by an end of the post. The end of the post is configured for breakage to expose an end of the channel to the surrounding environment of the carrier grid. When the channel is exposed, gas will discharge to the immediate area of the post. A focused ion beam directed at the junction of a sample positioned on the post near the discharging gas causes material of the gas to deposit at the junction of the sample and the post, thereby attaching the sample to the post.

Figure 15:
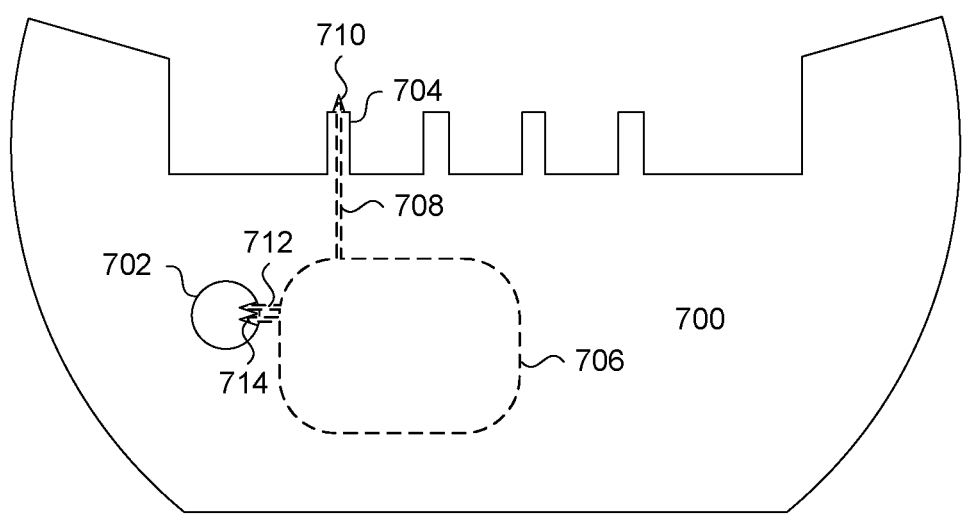
FIG. 15 shows a TEM sample carrier grid with an integrated gas delivery system, according to a present embodiment.

FIG. 15 shows a plan view a carrier grid with integrated gas delivery system fabricated in a silicon wafer technology, according to a present embodiment. The thickness of the silicon grid 700 is selected to be compatible with standard TEM holders. In FIG. 15, the thickness of the grid would extend into the page of the drawing. Also shown in FIG. 15 is a round alignment hole 702 which acts as a visual cue for an operator to orient the carrier grid within the TEM chamber, via the carrier grid holder (not shown). This example carrier grid 700 has four posts 704 each sized to be about 80×100×190 μm (W×D×H). A sample such as a thinly cut lamella (not shown) can be attached to one of the posts 704.

Carrier grid 700 has the same shape and configuration as carrier grid 400 shown in FIG. 10. Where the prior art carrier grid 400 is a solid single panel of material, the novel silicon carrier grid 700 has formed within it at least one reservoir 706 or space and at least one channel 708 that extends from the reservoir 706 into at least one of the posts 704. The shape and number of reservoirs 706 depends on the area of the carrier grid 700 and the desired volume of gas to be stored in each reservoir. The walls of the reservoir 706 and the channel 708 are delineated by the dashed lines, which defines space within the carrier grid. At the end of post 704 is a removable post outlet tip 710 that seals the open end of channel 708. The post outlet tip 710 can be generally cone-shaped or pyramid shaped and hollow, so that the channel 708 extends into the cone. Therefore, cutting the post outlet tip 710 with the FIB near its base will open the channel 708 or 712 to the TEM chamber, thereby allowing the prestored gas within the reservoir 706 to escape. The gas within the reservoir 706 can be at any pressure that is greater than the negative pressure of the FIB chamber, which facilitates exit of the gas from the reservoir 706 and channel 708.

Therefore, a specimen such as a lamella positioned proximate to the end of post 704 near the cut post outlet tip 710 will have gas discharging in the immediate area. Now a charged particle beam such as the FIB beam or an electron beam directed at the junction of the specimen and the post will cause deposition and subsequent attachment of the sample to the post.

An additional optional reservoir discharge channel 712 extends from the reservoir 706 into the alignment hole 702, where its open end is sealed by discharge outlet tip 714 similar to post outlet tip 710. The purpose of the reservoir discharge channel is to facilitate full discharge of all gas within the reservoir 706 after the specimen has been successfully attached/welded to the post 704.

In the presently shown examples there are two optional reservoir discharge channels 712. The reservoir 706 is generally rectangular shaped, but can take on any desired shape and size depending on the volume of gas to be stored. While the channels are shown to have a linear path from the reservoir 706, the channels can follow any type of nonlinear path from the reservoir 706 to their respective tips 710. The channel size, namely the cross-sectional area of the channel, can be set to any size to control the discharge of gas from the outlet. It should be noted that is well understood in the art how to mathematically calculate the rate of discharge of a gas when the pressures of the reservoir and FIB chamber are known, as well as the dimensions of the reservoir and the channel.

Figure 16:
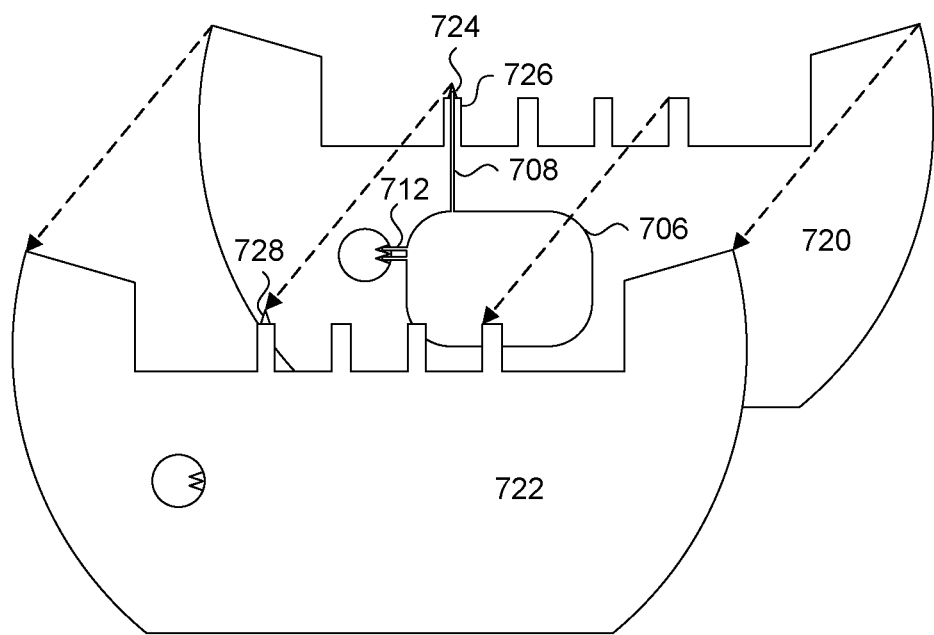
FIG. 16 is an exploded view of two TEM sample carrier grid panels prior to joining together to form a single carrier grid having integrated gas delivery system, according to a present embodiment.

Following is a discussion of how the carrier grid with integrated gas delivery system of the present embodiment is constructed, with reference to FIG. 16. FIG. 16 is an exploded view of the panels of the carrier grid 700 shown in FIG. 15. The carrier grid with integrated gas delivery system is made up of 2 separate silicon panels 720 and 722, each having an external shape the same as the other. On one panel 720, an inside face is etched or processed to form the reservoir 706 and the channels 708 and 712 by the removal of material from the surface thereof to the desired size in area and depth. As shown in FIG. 16, one tip half 724 is formed with the post half 726 to include the channel 708 (or 712) extending into it.

The second panel 722 has all the same structures as panel 720 except for the reservoir and channel formations and therefore remains flat surfaced. Both panels 720 and 722 are aligned and hermetically bonded to each other. Because the inside surface of panel 722 is flat, including the complementary tip half 728 all the channels and the reservoir 706 of panel 720 are sealed. This alignment and bonding process is done within a chamber having the desired gas to be stored within the reservoir and the channels. Once bonded together, the silicon carrier grid with integrated gas delivery system is now ready for use.

While the embodiments show a very specific carrier grid shape, the presently described embodiments can be applied to a carrier grid having any shape. The reservoir 706 and channels 708 and 712 can be formed/fabricated using standard silicon wafer technology. In one example, fabrication of such a TEM grid with built-in gas reservoir can employ a semiconductor fabrication process designed for producing microfluidic devices. Such processes are configured to form channels and reservoirs for fluid and can be applied to one face of the first silicon grid panel. Those of skill in the art should understand that current semiconductor fabrication processes can be used to etch, or remove material from a silicon surface using standard patterning techniques. Ultimately, any technique can be used to form the reservoir and channels.

Once the silicon grid panel 720 has the reservoir 706 and channels 708 and 712 formed therein, any suitable wafer bonding process can be used to bond the second silicon grid panel 722 to the first silicon grid panel 720 to hermetically seal the channels and reservoir within the completed carrier grid. More specifically, the first and second silicon grid panels 720 and 722 can be bonded to each other within a chamber filled with the desired gas to be sealed within the completed carrier grid.

Figure 17:
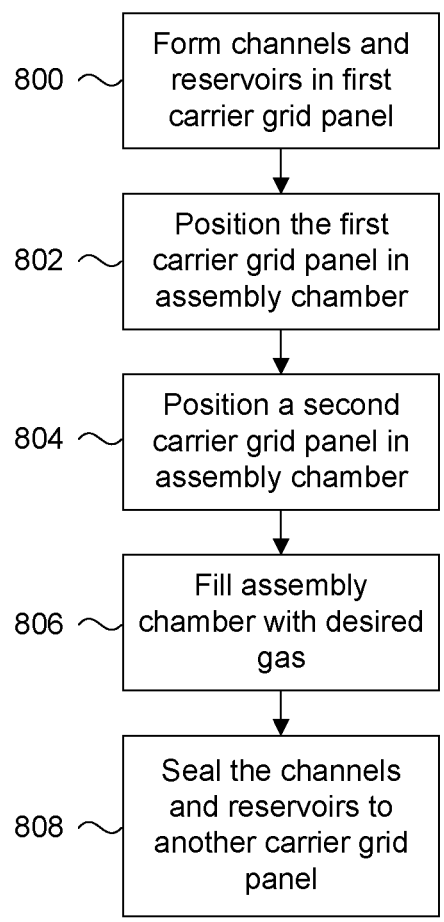
FIG. 17 is a flowchart of a method for fabrication of the TEM sample carrier grid with an integrated gas delivery system, according to a present embodiment.

FIG. 17 is a flowchart showing a method of constructing a carrier grid with integrated gas delivery system according to a present embodiment. The method starts at 800 by using any known method for forming the channel(s) and reservoir(s) in a face of a first carrier grid panel, which in the present embodiments can be a silicon panel. At 802, the first carrier grid panel is then placed and positioned in an assembly chamber that is configured to receive a desired gas. A second carrier grid panel which does not have any channels or reservoirs formed therein is also placed into the assembly chamber at 804. The assembly chamber is then filled with the desired gas for storage in the formed reservoir(s) and channel(s) at 806, and the 2 carrier grid panels are aligned and sealed to each other such that the gas in the assembly chamber is sealed therein at 808. Now the carrier grid can be removed from the assembly chamber and used.

Following is a discussion of a method of using the carrier grid with integrated gas delivery system, such as the one shown in FIG. 15, for bonding a sample, such as a lamella, to a post of the carrier grid. Reference is made to the flowchart of FIG. 18.

The method starts at 900 by placing the carrier grid 700 with integrated gas delivery system into a corresponding holder of an FIB system. The sample, such as a lamella for example, is positioned adjacent to post outlet tip 710 of a post 704 at 902. Then at 904 the FIB can be directed to cut the post outlet tip 710 extending from the post 704. It is noted that once the post outlet tip 710 is cut to expose the channel 708 to the FIB chamber, the gas stored therein will discharge because the FIB chamber is pumped down to a negative pressure that is less than that of the reservoir 706.

In the presently described example, the channels 708 can have a constant width or diameter that extends from the post half 726 into the tip half 724. Therefore the post outlet tip 710 can be cut straight across in a direction normal to the axis of channel 708, or the post outlet tip 710 can be cut at an angle. In an alternate embodiment, the channel in the tip half 724 gradually constricts. Therefore, the post outlet tip 710 can be cut straight across in the direction normal to the axis of channel 708 closer to the tip to obtain an initial outflow rate of gas. If this outflow rate is insufficient, then the post outlet tip 710 can be cut straight across at a position closer to the top of post 704 to open a larger opening and increase the outflow rate of gas.

At 906, the gas is permitted to collect at the interface of the lamella with the post 704. Then at 908 the charged particle beam (FIB or SEM) is directed at the interface and material from the gas will deposit on both the post 704 and the lamella at the interface area to thereby weld the lamella to the post 704. A period of time can be allowed to pass to allow all of the gas within the reservoir and the channel to discharge into the chamber. Alternately, the discharge outlet tip(s) 714 can be cut by the FIB at 910 to open an additional channel for the outflow of the gas. In addition or alternate to the presence of the optional reservoir discharge channel 712 and discharge outlet tip 714, the FIB can be directed to punch one or more holes straight through the reservoir 706 to facilitate the discharge of gas.

As previously mentioned, the carrier grid with integrated gas delivery system can be used in cryo applications, where the lamella may be organic or some other material that must be maintained in a frozen state. By example, the FIB chamber may be maintained at a temperature as low as −80° C. At such temperatures, the presence of gas in an area can change the local pressure in the area. In the context of a frozen lamella, a sudden change in local pressure can cause a small amount of melting to occur.

Figure 18:
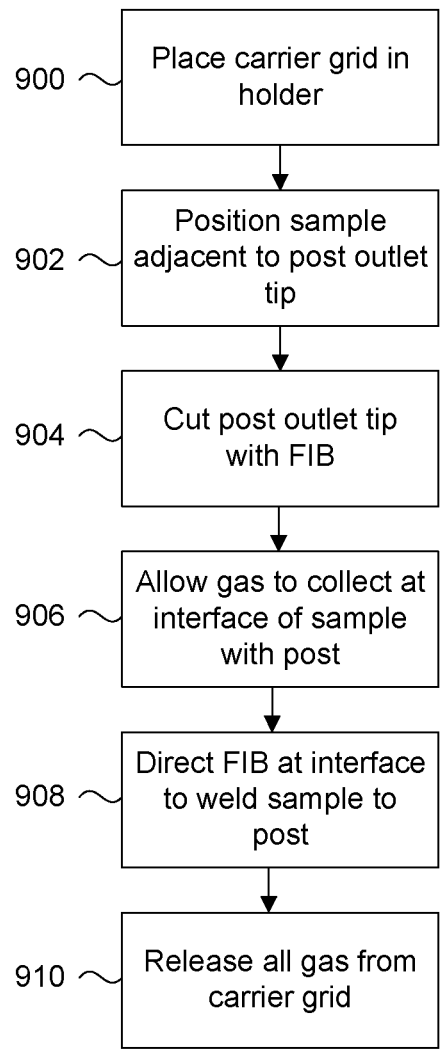
FIG. 18 is a flowchart of a method for attachment of a sample to the TEM sample carrier grid with an integrated gas delivery system, according to a present embodiment.

Therefore the present method of FIG. 18 can be adjusted to omit step 908, because after the gas has collected at the interface of the sample, the local pressure change will cause a small amount of the lamella to melt. Provided the sample is directly or almost in direct contact with the post, the melted material will freeze to the post and attach the sample to it.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

The invention claimed is:

1. A method for preparing a time optimized pre-lamella sample with a focused ion beam (FIB) system, comprising:
   milling a first trench into a surface of a material by varying FIB parameters during milling to change the first trench depth
   as a function of a direction normal to and away from a first side wall of the pre-lamella sample to result in a first predetermined gradient, and
   as a function of at least one direction substantially parallel to the first side wall to result in a second predetermined gradient;
   milling a second trench into the surface of the material spaced from the first trench by varying FIB parameters during milling to change the second trench depth
   as a function of a direction normal to and away from a second side wall of the pre-lamella sample to result in a third predetermined gradient, and
   as a function of the at least one direction substantially parallel to the second side wall to result in a fourth predetermined gradient,
   where the space between the first and second trenches defines an approximate width of the pre-lamella sample;
   rotating the material for the three dimensional depth profile of the second trench to provide line of sight between the FIB column and bottom and side edges of the second side wall of the pre-lamella sample; and cutting the bottom and side edges of the pre-lamella sample connected to the material to facilitate mechanical removal of the pre-lamella sample from the material.

2. The method of claim 1, wherein milling the first trench includes milling the first side wall to a first depth and milling the second trench includes milling the second side wall to a second depth less than the first depth.

3. The method of claim 1, wherein milling the first trench includes varying any one of dose, dwell time or spacing of the focused ion beam from the first side wall to the surface of the material in a direction normal to the first side wall.

4. The method of claim 3, wherein milling the second trench includes varying any one of dose, dwell time or spacing of the focused ion beam from the second side wall to the surface of the material in a direction normal to the second side wall.

5. The method of claim 4, wherein the dose, the dwell time or the spacing of the focused ion beam is varied in the direction substantially parallel to the second side wall while milling the second trench from the second side wall to the surface of the material in a direction normal to the second side wall.

6. The method of claim 3, wherein the dose, the dwell time or the spacing of the focused ion beam is varied in the at least one direction substantially parallel to the first side wall while milling the first trench from the first side wall to the surface of the material in a direction normal to the first side wall.

7. The method of claim 1, wherein the pre-lamella sample has a rectangular shaped analysis area and a triangle shaped handle area extending from the rectangular shaped analysis area.

8. The method of claim 1, further including polishing the first side wall and the second side wall prior to rotating the material.

9. The method of claim 1, wherein rotating the material includes rotating the material by approximately 90°.

10. The method of claim 9, wherein the first side wall has a length that completely overlaps the second side wall and the entire area defined by the second side wall forms the pre-lamella sample.

11. The method of claim 1, wherein the first side wall partially overlaps the second side wall, and the overlapping portions of the first side wall and the second side wall forms the pre-lamella sample.

12. The method of claim 1, including maintaining a stage supporting the material at a constant tilt angle during milling of the first trench, milling of the second trench, rotating the material and cutting the bottom and side edges of the pre-lamella sample.

13. The method of claim 12, wherein the constant tilt angle is a 0° tilt angle.

14. The method of claim 1, including applying a tilt to a stage supporting the material prior to cutting the bottom and side edges of the pre-lamella sample.

15. The method of claim 1, wherein cutting includes fully cutting the bottom and a first side edge of the pre-lamella sample, and partially cutting a second side edge of the pre-lamella sample to leave a portion thereof connected to the material.

16. The method of claim 15, further including attaching a lift out device to the pre-lamella sample prior to cutting.

17. The method of claim 16, wherein attaching the lift out device includes gas-assisted deposition of the lift out device to the pre-lamella sample.

18. The method of claim 16, wherein attaching the lift out device includes attachment of the lift out device to the pre-lamella sample without a gas deposition precursor.

19. The method of claim 16, wherein attaching the lift out device includes gripping the pre-lamella sample with a micro tweezer.

20. The method of claim 19, further including moving the pre-lamella sample with the micro tweezer to a substrate carrier, and attaching the sample to the substrate carrier prior to releasing the micro tweezer.

21. The method of claim 20, further includes attachment of the pre-lamella sample to the surface of the substrate carrier without a gas deposition precursor.

22. The method of claim 1, wherein at least one of the first trench and the second trench has a polygonal planar outline that is not rectangular or trapezoid in shape.

* * * * *

UNITED STATES PATENT AND TRADEMARK OFFICE
CERTIFICATE OF CORRECTION

PATENT NO. : 11,366,074 B2
APPLICATION NO. : 16/754925
DATED : June 21, 2022
INVENTOR(S) : Michael William Phaneuf, Ken Guillaume Lagarec and Andrew John Murray It is certified that error appears in the above-identified patent and that said Letters Patent is hereby corrected as shown below:

In the Specification

At Column 21, Line 59, delete the text "-80" and insert -- -180--

Signed and Sealed this
Twenty-first Day of November, 2023

Katherine Kelly Vidal
*Director of the United States Patent and Trademark Office*